US012666687B2

(12) United States Patent
Wang

(10) Patent No.: US 12,666,687 B2
(45) Date of Patent: Jun. 23, 2026

(54) FIELD EFFECT TRANSISTOR WITH GATE ELECTRODE HAVING MULTIPLE GATE LENGTHS

(71) Applicant: Taiwan Semiconductor Manufacturing Co., Ltd., Hsinchu (TW)

(72) Inventor: Pei-Yu Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 552 days.

(21) Appl. No.: 18/168,465

(22) Filed: Feb. 13, 2023

(65) Prior Publication Data

US 2024/0105794 A1 Mar. 28, 2024

Related U.S. Application Data

(60) Provisional application No. 63/409,585, filed on Sep. 23, 2022.

(51) Int. Cl.
| | |
|---|---|
| *H10D 64/27* | (2025.01) |
| *H10D 30/01* | (2025.01) |
| *H10D 30/43* | (2025.01) |
| *H10D 30/67* | (2025.01) |
| *H10D 64/01* | (2025.01) |

(52) U.S. Cl.
CPC ......... *H10D 64/518* (2025.01); *H10D 30/014* (2025.01); *H10D 30/43* (2025.01); *H10D 30/6735* (2025.01); *H10D 30/6757* (2025.01); *H10D 64/021* (2025.01)

(58) Field of Classification Search
CPC ........... H10D 30/6735; H10D 30/6757; H10D 64/021; H10D 30/43; H10D 30/014; H10D 64/518; H10D 64/017; H10D 64/151
See application file for complete search history.

(56) References Cited

U.S. PATENT DOCUMENTS

| | | | |
|---|---|---|---|
| 9,236,267 B2 | 1/2016 | De et al. | |
| 9,502,265 B1 | 11/2016 | Jiang et al. | |
| 9,520,466 B2 | 12/2016 | Holland et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,704,863 B1 * | 7/2017 | Cheng ................ | H10D 30/6735 |
| 9,786,774 B2 | 10/2017 | Colinge et al. | |
| 9,853,101 B2 | 12/2017 | Peng et al. | |

(Continued)

FOREIGN PATENT DOCUMENTS

| | | |
|---|---|---|
| TW | 202203324 A | 1/2022 |
| TW | 202207310 A | 2/2022 |
| TW | 202232582 A | 8/2022 |

*Primary Examiner* — Changhyun Yi
(74) *Attorney, Agent, or Firm* — Seed IP Law Group

(57) ABSTRACT

An integrated circuit includes a semiconductor nanostructure transistor. The semiconductor nanostructure transistor includes a plurality of semiconductor nanostructures corresponding to channel regions conductor Nanostructure transistor. A gate metal surrounds the semiconductor nanostructures. The gate metal has differing gate length dimension above the semiconductor nanostructures compared to the gate length between the semiconductor nanostructures.

20 Claims, 26 Drawing Sheets

(56)　　　　　　References Cited

U.S. PATENT DOCUMENTS

| | | | |
|---|---|---|---|
| 9,881,993 | B2 | 1/2018 | Ching et al. |
| 9,929,235 | B1 * | 3/2018 | Yang .................... H10D 62/119 |
| 2019/0058051 | A1 * | 2/2019 | Kim .................... H10D 30/014 |
| 2020/0075772 | A1 * | 3/2020 | Xu .................... H10D 30/0323 |
| 2021/0226020 | A1 * | 7/2021 | Lin .................... H10D 30/6757 |
| 2021/0288184 | A1 | 9/2021 | Cheng et al. |
| 2021/0366910 | A1 | 11/2021 | Bhuwalka et al. |
| 2022/0254623 | A1 | 8/2022 | Chiang et al. |
| 2022/0320312 | A1 * | 10/2022 | Park .................... H10D 62/121 |

* cited by examiner

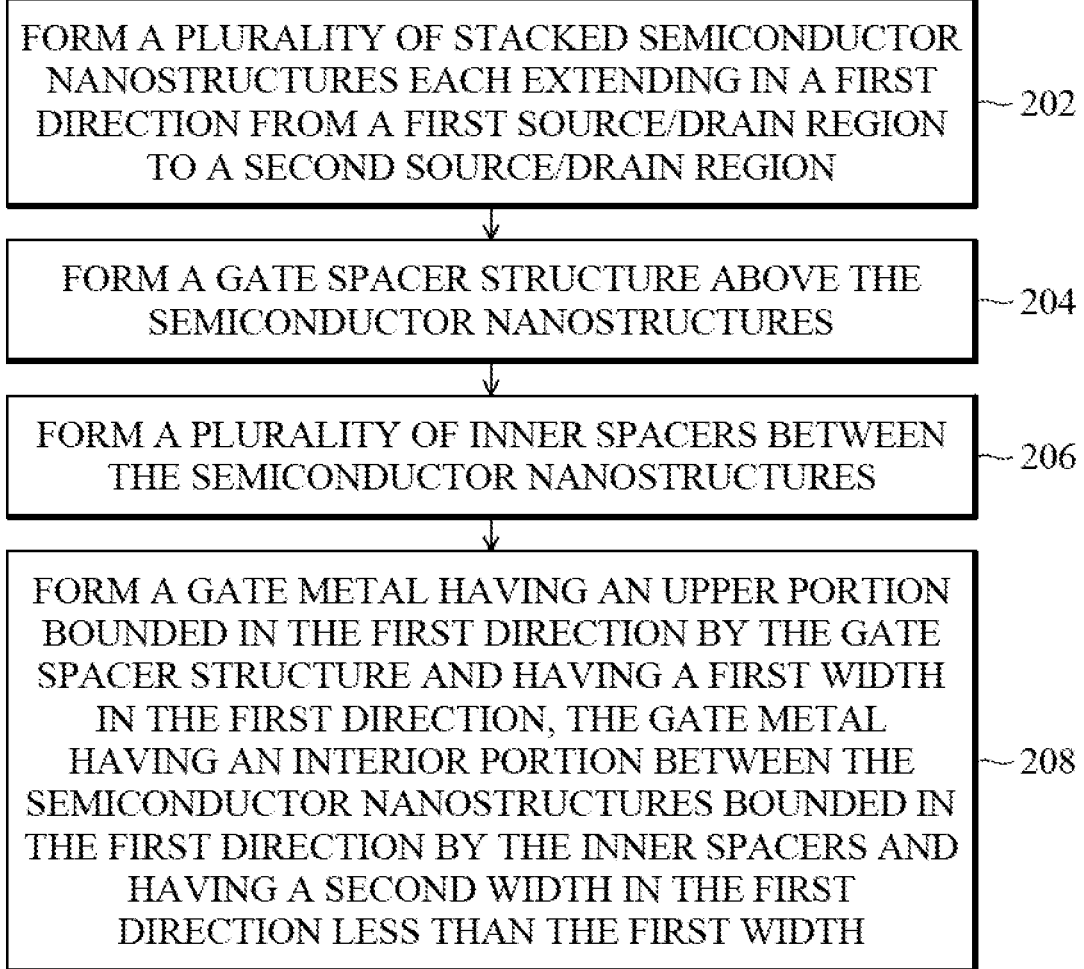

200

FORM A PLURALITY OF STACKED SEMICONDUCTOR NANOSTRUCTURES EACH EXTENDING IN A FIRST DIRECTION FROM A FIRST SOURCE/DRAIN REGION TO A SECOND SOURCE/DRAIN REGION ⁓202

FORM A GATE SPACER STRUCTURE ABOVE THE SEMICONDUCTOR NANOSTRUCTURES ⁓204

FORM A PLURALITY OF INNER SPACERS BETWEEN THE SEMICONDUCTOR NANOSTRUCTURES ⁓206

FORM A GATE METAL HAVING AN UPPER PORTION BOUNDED IN THE FIRST DIRECTION BY THE GATE SPACER STRUCTURE AND HAVING A FIRST WIDTH IN THE FIRST DIRECTION, THE GATE METAL HAVING AN INTERIOR PORTION BETWEEN THE SEMICONDUCTOR NANOSTRUCTURES BOUNDED IN THE FIRST DIRECTION BY THE INNER SPACERS AND HAVING A SECOND WIDTH IN THE FIRST DIRECTION LESS THAN THE FIRST WIDTH ⁓208

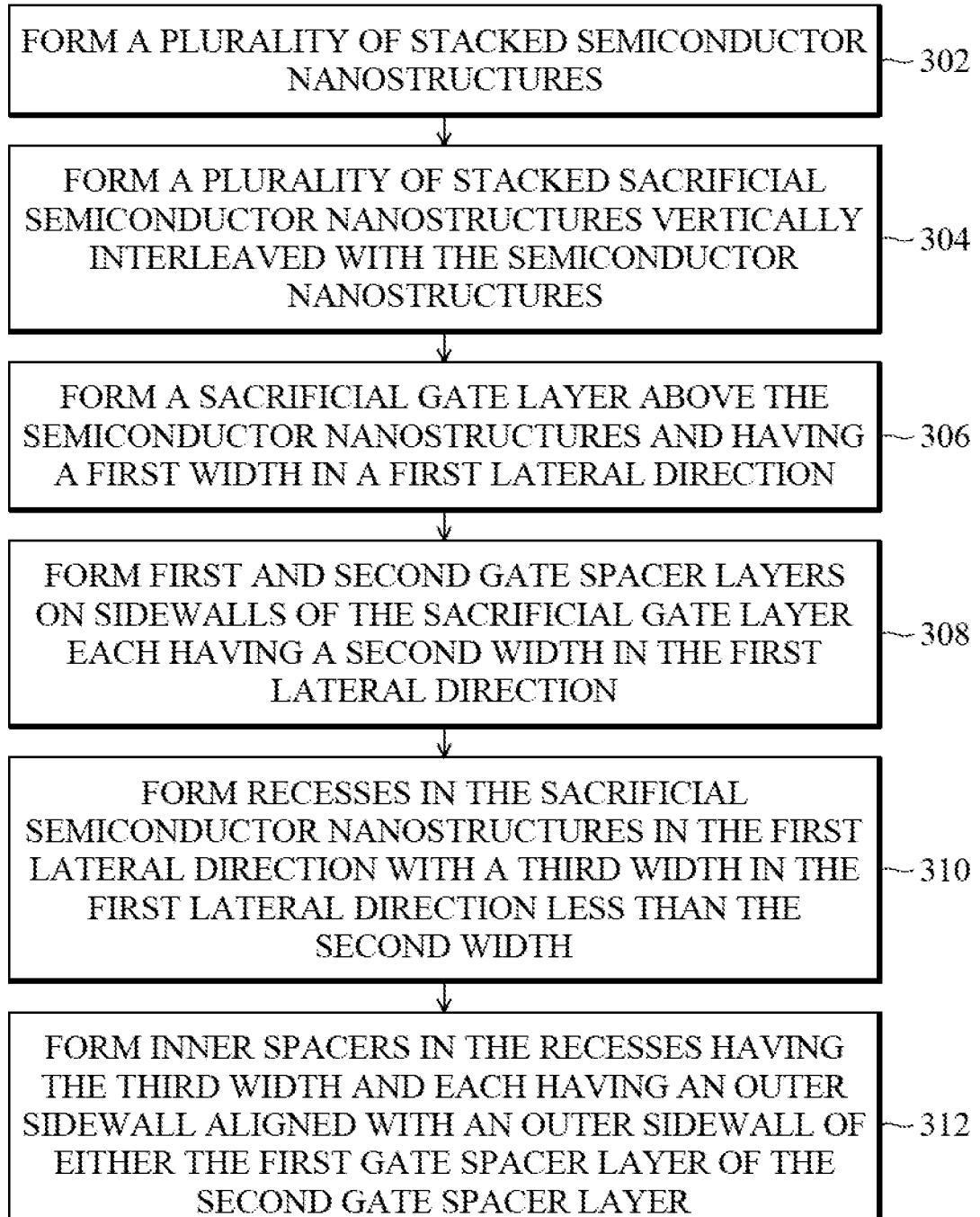

FORM A PLURALITY OF STACKED SEMICONDUCTOR NANOSTRUCTURES — 302

FORM A PLURALITY OF STACKED SACRIFICIAL SEMICONDUCTOR NANOSTRUCTURES VERTICALLY INTERLEAVED WITH THE SEMICONDUCTOR NANOSTRUCTURES — 304

FORM A SACRIFICIAL GATE LAYER ABOVE THE SEMICONDUCTOR NANOSTRUCTURES AND HAVING A FIRST WIDTH IN A FIRST LATERAL DIRECTION — 306

FORM FIRST AND SECOND GATE SPACER LAYERS ON SIDEWALLS OF THE SACRIFICIAL GATE LAYER EACH HAVING A SECOND WIDTH IN THE FIRST LATERAL DIRECTION — 308

FORM RECESSES IN THE SACRIFICIAL SEMICONDUCTOR NANOSTRUCTURES IN THE FIRST LATERAL DIRECTION WITH A THIRD WIDTH IN THE FIRST LATERAL DIRECTION LESS THAN THE SECOND WIDTH — 310

FORM INNER SPACERS IN THE RECESSES HAVING THE THIRD WIDTH AND EACH HAVING AN OUTER SIDEWALL ALIGNED WITH AN OUTER SIDEWALL OF EITHER THE FIRST GATE SPACER LAYER OF THE SECOND GATE SPACER LAYER — 312

Figure 3

FIELD EFFECT TRANSISTOR WITH GATE ELECTRODE HAVING MULTIPLE GATE LENGTHS

BACKGROUND

The semiconductor integrated circuit industry has experienced exponential growth. Technological advances in integrated circuit materials and design have produced generations of integrated circuits where each generation has smaller and more complex circuits than the previous generation. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a flow diagram of a method for forming an integrated circuit, in accordance with some embodiments.

FIG. 3 is a flow diagram of a method for forming an integrated circuit, in accordance with some embodiments.

DETAILED DESCRIPTION

Figure 1A:
FIGS. 1A-1X are cross-sectional, perspective, and plane views of an integrated circuit at intermediate stages of processing, in accordance with some embodiments.
Figure 1A:
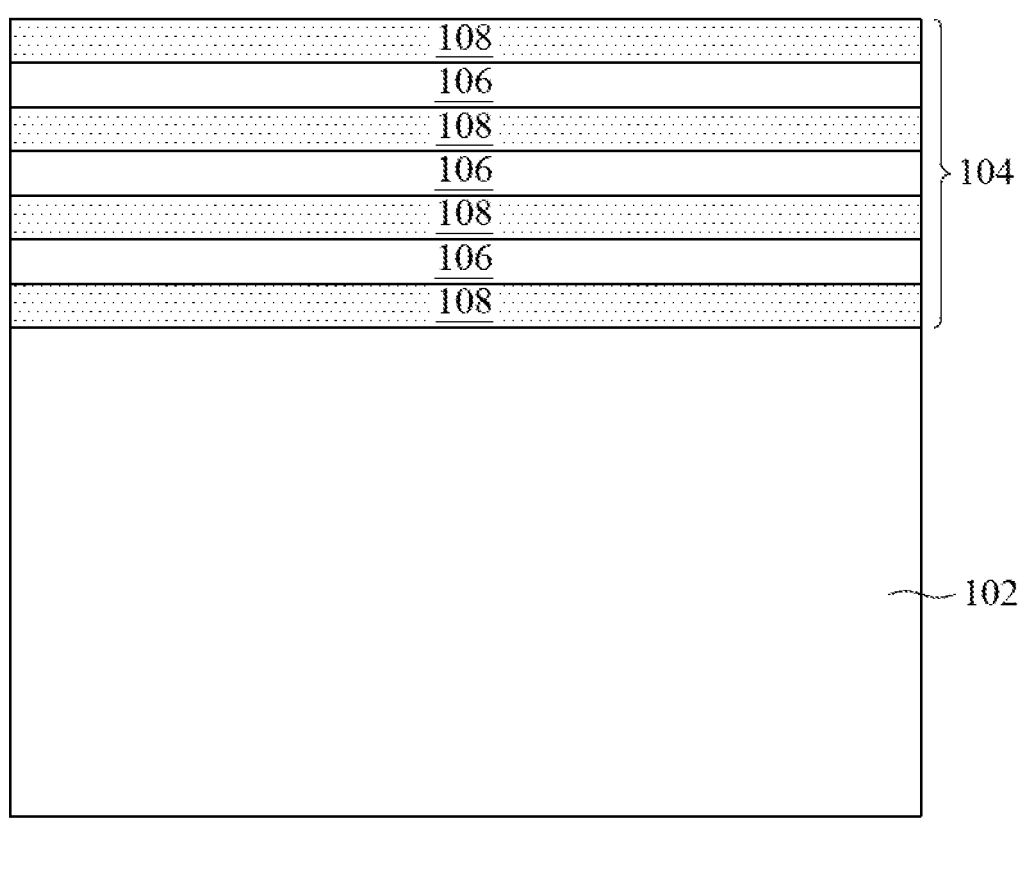

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about." "substantially." and the like, should be interpreted as one having ordinary skill in the art would in view of current technological norms.

The present disclosure is generally related to semiconductor devices, and more particularly to field-effect transistors (FETs), such as planar FETs, three-dimensional fin FETs (FinFETs), or nanostructure devices. Examples of nanostructure devices include gate-all-around (GAA) devices, nanosheet FETs (NSFETs), nanowire FETs (NWFETs), and the like. In such devices, active area spacing between nanostructure devices may be uniform, source/drain epitaxy structures may be symmetrical, and a metal gate may surround four sides of the nanostructures (e.g., nanosheets). Gate-drain capacitance ("Cgd") may be increased due to larger metal gate endcap and increased source/drain epitaxy size.

Embodiments of the disclosure reduce a gate to drain capacitance by providing a semiconductor nanostructure transistor having a plurality of semiconductor nanostructures and a gate electrode having differing widths at different areas of the transistor. The gate electrode includes one or more gate metals. A lower portion of the gate metal surrounds the semiconductor nanostructures. An upper portion of the gate metal is positioned above the semiconductor nanostructures. The lower portion of the gate metal has a gate length that is larger than the gate length of the upper portion of the gate metal. The reduced length of the second portion of the gate metal results in a reduced gate to drain capacitance. The reduction in gate to drain capacitance is based, in part, on an increased separation distance between the upper portion of the gate electrode and the adjacent source/drain contacts. The result is a transistor having improved electrical characteristics including switching speed, channel control, and overall reliability. This leads to better functioning integrated circuits and higher wafer yields.

The nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure transistor structure.

FIGS. 1A-IT are cross-sectional, perspective, and plan view of a portion of an integrated circuit 100 fabricated according to some embodiments of the present disclosure. The fabrication process results in a plurality of semiconductor nanostructure transistors 135, as will be described in further detail below.

FIGS. 1A-IT define mutually orthogonal X, Y, and Z-axes. The z-axis corresponds to a vertical axis. The X and Y-axes corresponds to horizontal axes. The x-axis corresponds to the direction of current flow through the semiconductor nanostructures that correspond to the channel regions of a transistor, as will be described in further detail below. A cross-sectional view may be described as an X view when the X-axis is the horizontal axis and the Z-axis is the vertical axis. A cross-sectional view may be described as a Y-view when the Y-axis is the horizontal axis and the Z-axis is the vertical axis.

FIG. 1A is a cross-sectional view of the integrated circuit 100 at an intermediate state of processing. The integrated circuit 100 includes a substrate 102. The substrate 102 may be a semiconductor substrate, such as a bulk semiconductor, or the like, which may be doped (e.g., with a p-type or an n-type dopant) or undoped. The semiconductor material of the substrate 102 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

The integrated circuit 100 includes a semiconductor stack 104 including a plurality of semiconductor layers 106 and sacrificial semiconductor layers 108 alternating with each other. As will be set forth in further detail below, the semiconductor layers 106 will be patterned to form semiconductor nanostructures of a plurality of transistors, though only a single transistor will be illustrated herein. As set forth in more detail below, the sacrificial semiconductor layers 108 will eventually be entirely removed and are utilized to enable forming gate metals and other structures around the semiconductor nanostructures.

In some embodiments, the semiconductor layers 106 may be formed of a first semiconductor material suitable for n-type semiconductor nanostructure transistors, such as silicon, silicon carbide, or the like, and the sacrificial semiconductor layers 108 may be formed of a second semiconductor material suitable for p-type semiconductor nanostructure transistors, such as silicon germanium or the like. Each of the layers of the multi-layer stack 104 may be epitaxially grown using a process such as chemical vapor deposition (CVD), atomic layer deposition (ALD), vapor phase epitaxy (VPE), molecular beam epitaxy (MBE), or the like. In a non-limiting example, the substrate 102 and the semiconductor layers 106 are silicon, while the sacrificial semiconductor layers 108 are silicon germanium. Other combinations of materials can be utilized without departing from the scope of the present disclosure.

In FIG. 1A, the highest sacrificial semiconductor layer 108 corresponds to the top of the stack 104. The top sacrificial semiconductor layer 108 may act as a hard mask layer in patterning the semiconductor stack 104. In some embodiments, the top of the stack 104 may be a semiconductor layer 106 rather than the sacrificial semiconductor layer 108.

Three layers of each of the semiconductor layers 106 and the sacrificial semiconductor layers 108 are illustrated. In some embodiments, the multi-layer stack 104 may include one or two each or four or more each of the semiconductor layers 106 and the sacrificial semiconductor layers 108. Although the multi-layer stack 104 is illustrated as including a sacrificial semiconductor layer 108 as the bottommost layer of the multi-layer stack 104, in some embodiments, the bottommost layer of the multi-layer stack 104 may be a semiconductor layer 106.

Due to high etch selectivity between the materials of the semiconductor layers 106 and the sacrificial semiconductor layers 108, the sacrificial semiconductor layers 108 of the second semiconductor material may be removed without significantly removing the semiconductor layers 106 of the first semiconductor material, thereby allowing the semiconductor layers 106 to be released to form channel regions of semiconductor nanostructure transistors.

Though not shown in FIG. 1A, the integrated circuit 100 may include a hard mask layer formed over the top sacrificial semiconductor layer 108. In some embodiments, the hard mask layer may include silicon. Other materials may be utilized for the dielectric layer and the hard mask layer without departing from the scope of the present disclosure. The hard mask layer may be utilized to define a plurality of fins from the semiconductor stack 104. The fins may extend in the X direction and may be separated laterally from each other in the Y direction. A plurality of semiconductor nanostructure transistors may be formed from each fin.

The view of FIG. 1A may correspond to a single semiconductor fin that extends in the Y direction. The single fin may be separated from parallel fins by trenches. The trenches may include shallow trench isolation structures and other dielectric structures to separate and electrically isolate adjacent fins. After formation of the fins, shallow trench isolation regions, and the dielectric isolation structures between the fins, the hard mask layer may be removed, substantially resulting in the view of FIG. 1A.

Figure 1B:
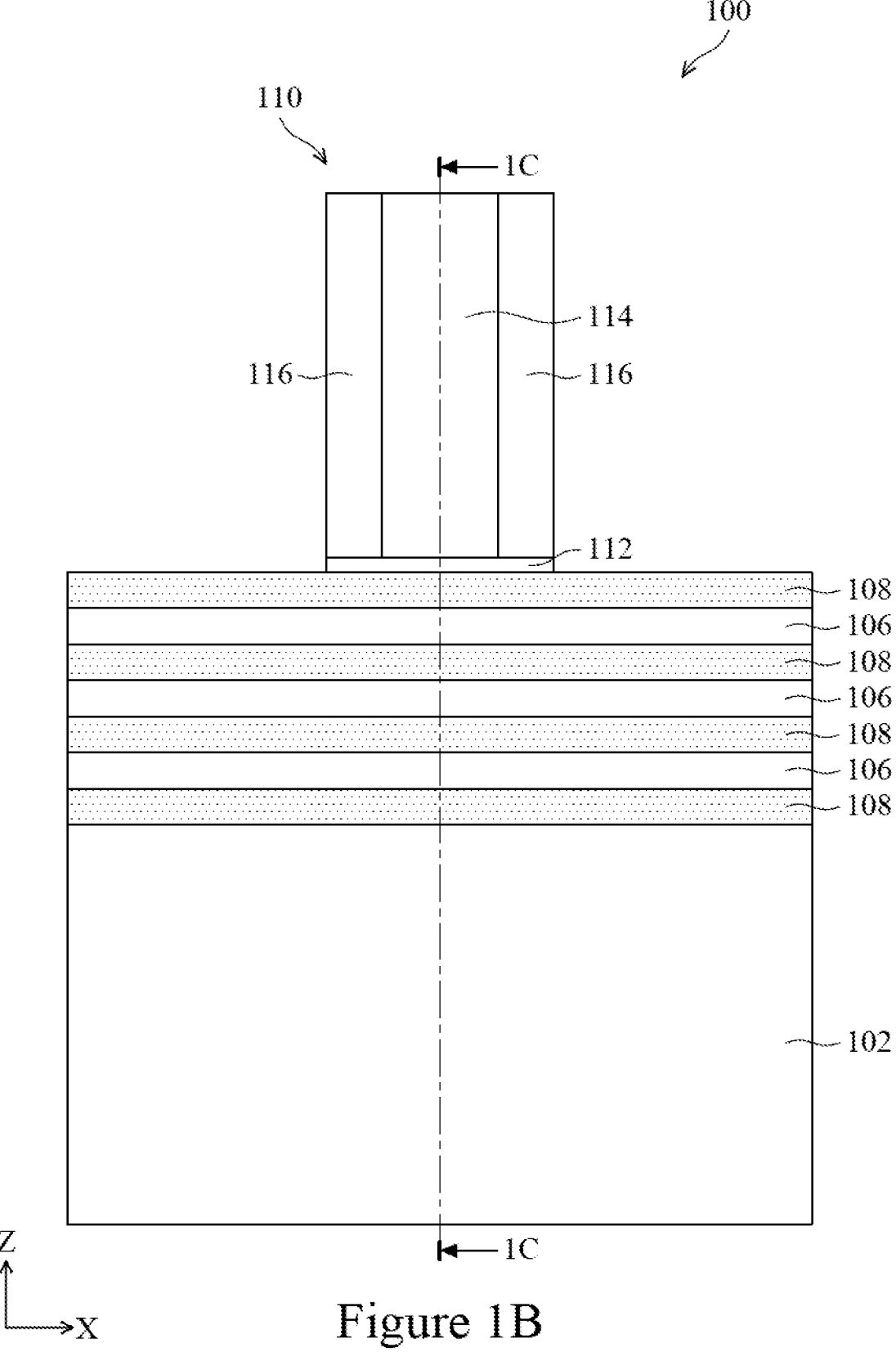

In FIG. 1B, sacrificial gate structures 110 have been formed over the semiconductor stack 104. The sacrificial gate structure 110 extends in the X direction and crosses the semiconductor stack 104. In practice, the sacrificial gate structure 110 extends across a plurality of adjacent semiconductor fins. One sacrificial gate structure 110 is shown in FIG. 1B. In practice, many further sacrificial gate structures 110 may be formed substantially parallel to and concurrently with the sacrificial gate structure 110 shown in FIG. 1B.

The sacrificial gate structure 110 includes a dielectric layer 112 has been formed prior to forming the sacrificial gate structures 110. The dielectric layer 112 can include a SiO or other suitable dielectric materials. In some embodiments, the dielectric layer 112 has a low K dielectric material. The dielectric layer 112 can be deposited by CVD, ALD, or PVD. Other materials and deposition processes can be utilized for the dielectric layer 112 without departing from the scope of the present disclosure.

The sacrificial gate structures include a sacrificial gate layer 114 on the dielectric layer 112. The sacrificial gate layer can include materials that have a high etch selectivity with respect to the trench isolation regions (see FIG. 1C). The sacrificial gate layer 114 may be a conductive, semiconductive, or non-conductive material and may be or include amorphous silicon, polycrystalline-silicon (polysilicon), poly-crystalline silicon-germanium (poly-SiGe), metallic nitrides, metallic silicides, metallic oxides, and metals. The sacrificial gate layer 114 may be deposited by physical vapor deposition (PVD), CVD, sputter deposition, or other techniques for depositing the selected material.

Though not shown in FIG. 1B, the sacrificial gate structure 110 may include additional dielectric layers above the sacrificial gate layer 114. In some embodiments, the sacrificial gate structure includes a first upper dielectric layer directly on the sacrificial gate layer 114 and a second upper dielectric layer directly on the first upper dielectric layer. The first and second upper dielectric layers may correspond to first and second mask layers. The first upper dielectric layer can include silicon nitride, silicon oxynitride, or other suitable dielectric materials. The second upper dielectric layer can include silicon nitride, silicon oxynitride or other suitable dielectric materials. The first and second upper dielectric layers are different materials from each other and can be deposited using CVD, ALD, PVD, or other suitable deposition processes. Other materials and deposition processes can be utilized for the first and second upper dielectric layers without departing from the scope of the present disclosure.

After deposition of the layers 112, 114, and the first and second upper dielectric layers, these layers may be patterned to act as mask layers. An etching process may then be performed in the presence of the patterned dielectric layers in order to etch exposed regions of the sacrificial gate layer 114 and the sacrificial gate dielectric layer 112. The results of the layers 112 and 114 having the shape shown in FIG. 1B.

In some embodiments, the width dimension of the sacrificial gate layer 114 is selected to result in a relatively small gate length of an upper portion of a gate metal that will be formed in place of the sacrificial gate layer 114 in subsequent steps. In some embodiments, the width of the sacrificial gate layer 114 in the X direction is between 7 nm and 14 nm. The gate length of a lower portion of the gate metal that will be subsequently formed is greater than the gate length of the upper portion of the gate metal by a value between 1 nm and 3 nm.

In FIG. 1B, one or more gate spacer layers 116 have been formed covering the sacrificial gate structures 110. The gate spacer layer 116 can be formed by PVD, CVD, ALD, or other suitable deposition processes. Gate spacer layers may have a width in the X direction between 3.5 nm and 8 nm. The gate spacer layers 116 can include one or more of SiO, SiN, SiON, SiCN, SiOCN, or SiOC. Other materials, deposition processes and thicknesses can be utilized for the gate spacer layers 116 without departing from the scope of the present disclosure The deposition process for the gate spacer layers 116 can include a conformal deposition process. The conformal deposition process deposits the material of the gate spacer layers 116 on all exposed horizontal and vertical surfaces. The conformal deposition process results in the horizontal thickness of the gate spacer material on vertical surfaces having substantially same dimension as a vertical thickness of the gate spacer material on horizontal surfaces. Following the deposition of the material of the gate spacer layers 116, and an isotropic etching process can be performed that etches selectively in the downward direction. The duration of the anisotropic etching process is selected to entirely remove the material of the gate spacer layers 116 from horizontal surfaces. Adjacent to vertical surfaces, the vertical thickness of the material of the gate spacer layers 116 is substantially greater than on purely horizontal surfaces. The result is that the etching process does not remove the gate spacer layers 116 from the vertical surfaces. The results of the etching process is the structure shown in FIG. 1B.

Figure 1C:
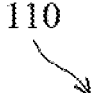

FIG. 1C is a cross-sectional view of the integrated circuit 100 of FIG. 1B taken along cut lines 1C in FIG. 1B, in accordance with some embodiments. FIG. 1C is a Y-view of the integrated circuit 100. The view of FIG. 1C illustrates that the semiconductor stack 104 corresponds to a fin. As described in relation to FIG. 1A, a plurality of fins were previously defined from the semiconductor stack 104, with the structure of FIG. 1A illustrating a portion of one fin that extends in the X direction. FIG. 1C illustrates the shape of the fin in the Y-Z plane.

FIG. 1C illustrates shallow trench isolation regions 118. The shallow trench isolation regions 118 are formed in the trenches between adjacent fins. The trenches extend into the substrate 102. After deposition of the shallow trench isolation regions 118 in the trenches, the top surfaces of the shallow trench isolation regions 118 are recessed to be substantially coplanar with a top of the substrate 102.

The trench isolation regions 118 may be formed by depositing a dielectric material. In some embodiments, the dielectric material is formed over the substrate 102 and the fins. The dielectric material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 102 and the fins. Thereafter, the dielectric material may be formed over the liner of a material such as those discussed above. The dielectric material can include silicon oxide or other suitable dielectric materials.

FIG. 1C illustrates that the dielectric layer 112 is formed on the top and side surfaces of the semiconductor fin. FIG. 1C illustrates that the sacrificial gate layer 114 overlies the fins and the shallow trench isolation regions 118 between fins.

Figure 1D:
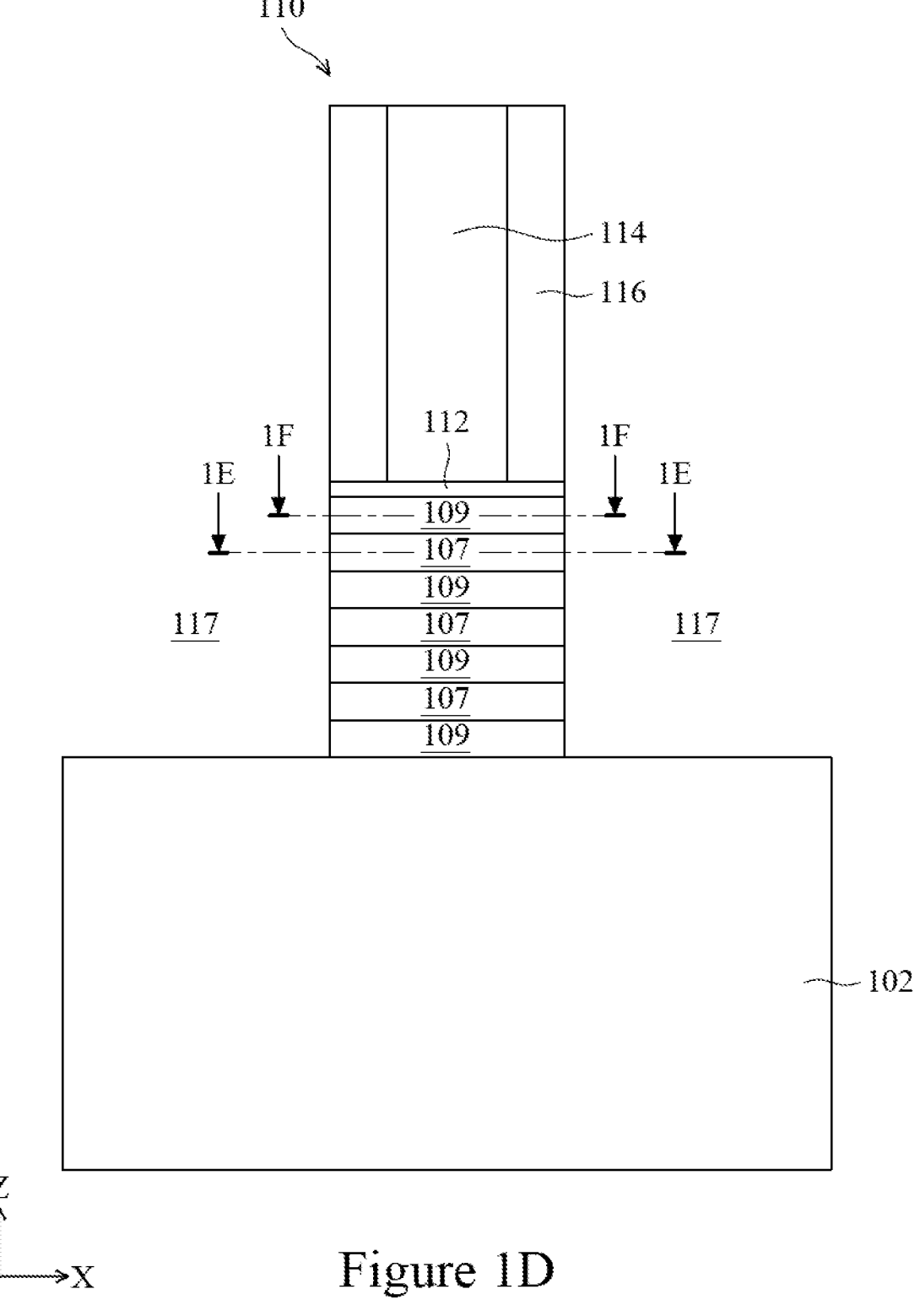
Figure 1E:
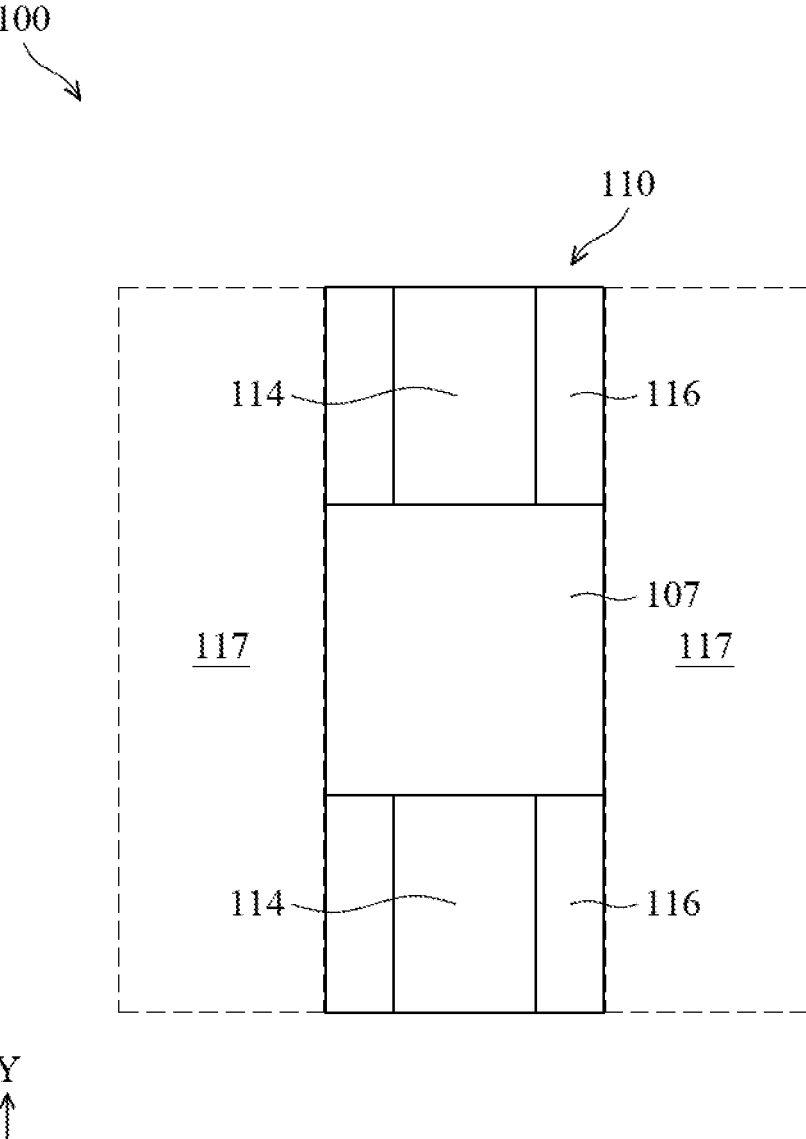
Figure 1F:
Figure 1F:
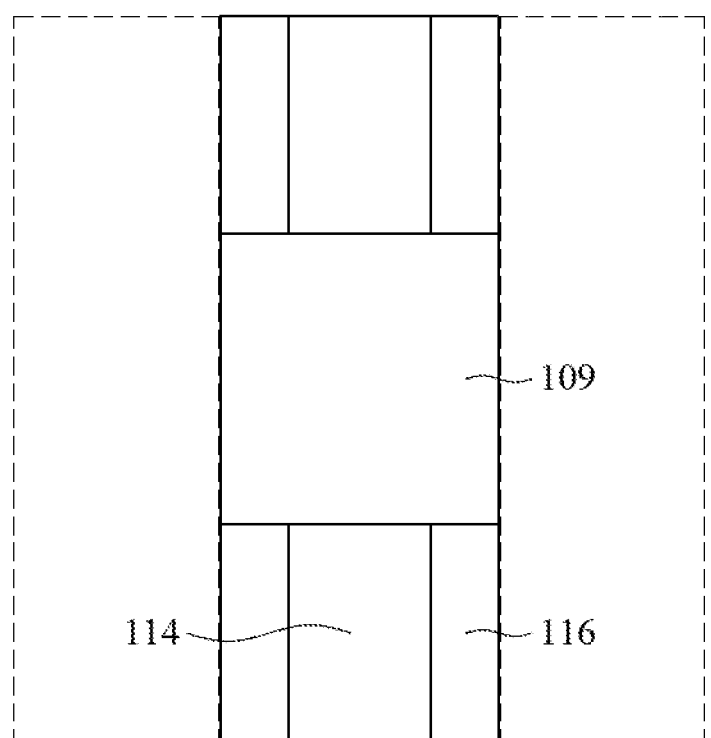
Figure 1F:
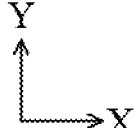
Figure 1G:
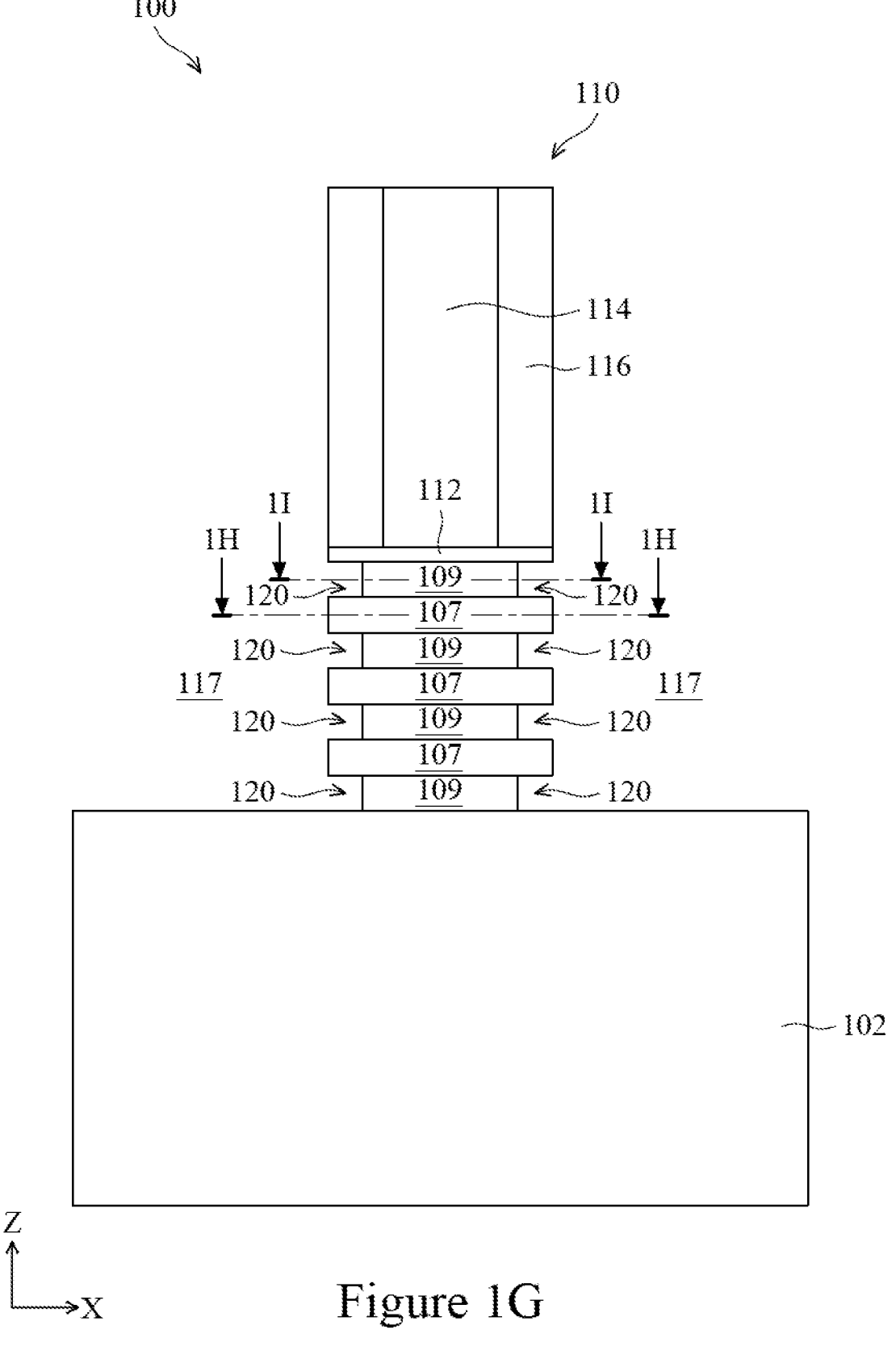
Figure 1H:
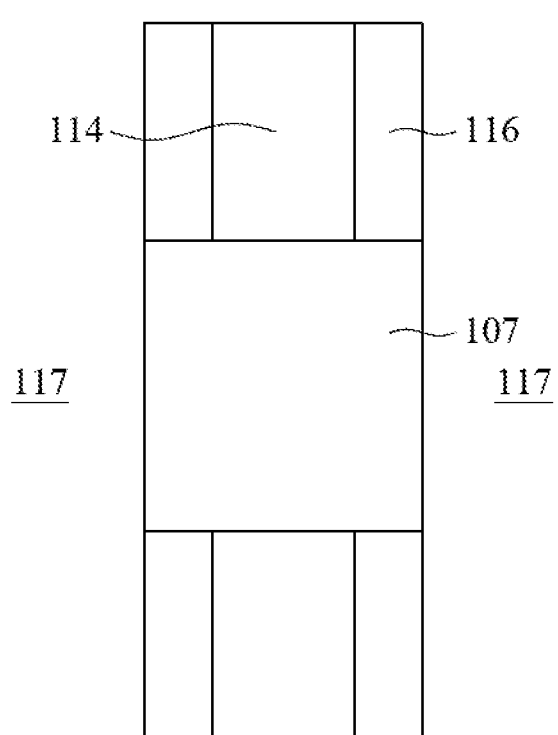

In FIG. 1H, one or more etching operations have been performed utilizing the gate spacer layer 116 and the sacrificial gate structure 110 as a mask. The portions of the semiconductor layers 106 and the sacrificial semiconductor layers 108 that are not directly below the gate spacer layer 116 and the sacrificial gate structure 110 are removed. The one or more etching processes defined semiconductor nanostructures 107 from the semiconductor layers 106. The one or more etching processes defined sacrificial semiconductor nanostructures 109 from the sacrificial semiconductor layers 108. As will be set forth in more detail below, the semiconductor nanostructures 107 correspond to stacked channel regions of a transistor 135. In particular, current may flow in the X direction through the semiconductor nanostructures 107 when the transistor 135 is turned on. As will be set forth in more detail below, the sacrificial semiconductor nanostructures 109 will eventually be entirely removed.

The one or more etching operations may include suitable etch operations for removing materials of the semiconductor layers 106 and the sacrificial semiconductor layers 108. The one or more etching processes can include reactive ion etching (RIE), neutral beam etching (NBE), atomic layer etching (ALE), or the like. The one or more etching processes may form trenches 117 through the fins in the areas exposed by the gate spacer layers 116. In practice, a large number of trenches 117 may be formed through fin. Each pair of trenches may define a plurality of semiconductor nanostructures 107 corresponding to channel regions of a transistor. Between large numbers of sacrificial gate structures 110. The trenches 117 correspond to source/drain trenches. In particular, the source/drain regions will be formed at those locations where the fins have been recessed, as will be set forth in more detail below.

FIG. 1E is a plane view of the integrated circuit 100 taken through cut lines 1E of FIG. 1D, in accordance with some embodiments. FIG. 1E illustrates a semiconductor nanostructure 107 with source/drain trenches 117 on either side in the X direction. FIG. 1E also illustrates the portions of the sacrificial gate layer 114 and gate spacer layer 116 on either side of the semiconductor nanostructure 107 in the Y direction.

FIG. 1F is a plane view of the integrated circuit 100 taken through cut lines 1F of FIG. 1D, in accordance with some embodiments. FIG. 1F illustrates a sacrificial semiconductor nanostructure 109 with source/drain trenches 117 on either side in the X direction. FIG. 1F also illustrates the portions of the sacrificial gate layer 114 and gate spacer layer 116 on either side of the sacrificial semiconductor nanostructure 109 in the Y direction.

FIG. 1G is an X view of the integrated circuit 100, in accordance with some embodiments. In FIG. 1G, a recessing process has been performed. The recessing process can include an etching process that selectively etches the material of the sacrificial semiconductor nanostructures 109 with respect to the material of the semiconductor nanostructures 107. The etching process is a timed etching process is selected to remove only a small portion of the sacrificial semiconductor nanostructures 109. The etching process can include an anisotropic etching process that etches in the horizontal direction or an anisotropic etching process. Various etching process can be utilized to recess the sacrificial semiconductor nanostructures 109 without departing from the scope of the present disclosure.

The results of the recessing process is that recesses 120 have been formed in the sacrificial semiconductor nanostructures 109 between the semiconductor nanostructures 107. The recesses 120 may have a dimension between 3 nm and 6 nm in the X direction. In some embodiments, the recessing process is selected to ensure that the width of the recesses 120 is less than the width of the gate spacer layers 116 in the X direction. As will be set forth in more detail below, the difference in width of the recesses 120 and the gate spacer layers 116 results in a gate metal having different widths at upper and lower regions. In some embodiments, the width of the recesses 120 is selected to be smaller than the width of the gate spacer layers 116 by between 0.5 nm and 1.5 nm. Other dimensions and processes can be utilized for the recesses 120 without departing from the scope of the present disclosure.

FIG. 1H is a plane view of the integrated circuit 100 taken through cut lines 1H of FIG. 1G, in accordance with some embodiments. FIG. 1H illustrates a semiconductor nanostructure 107 with source/drain trenches 117 on either side in the X direction. FIG. 1H also illustrates the portions of the sacrificial gate layer 114 and gate spacer layer 116 on either side of the semiconductor nanostructure 107 in the Y direction.

Figure 1I:
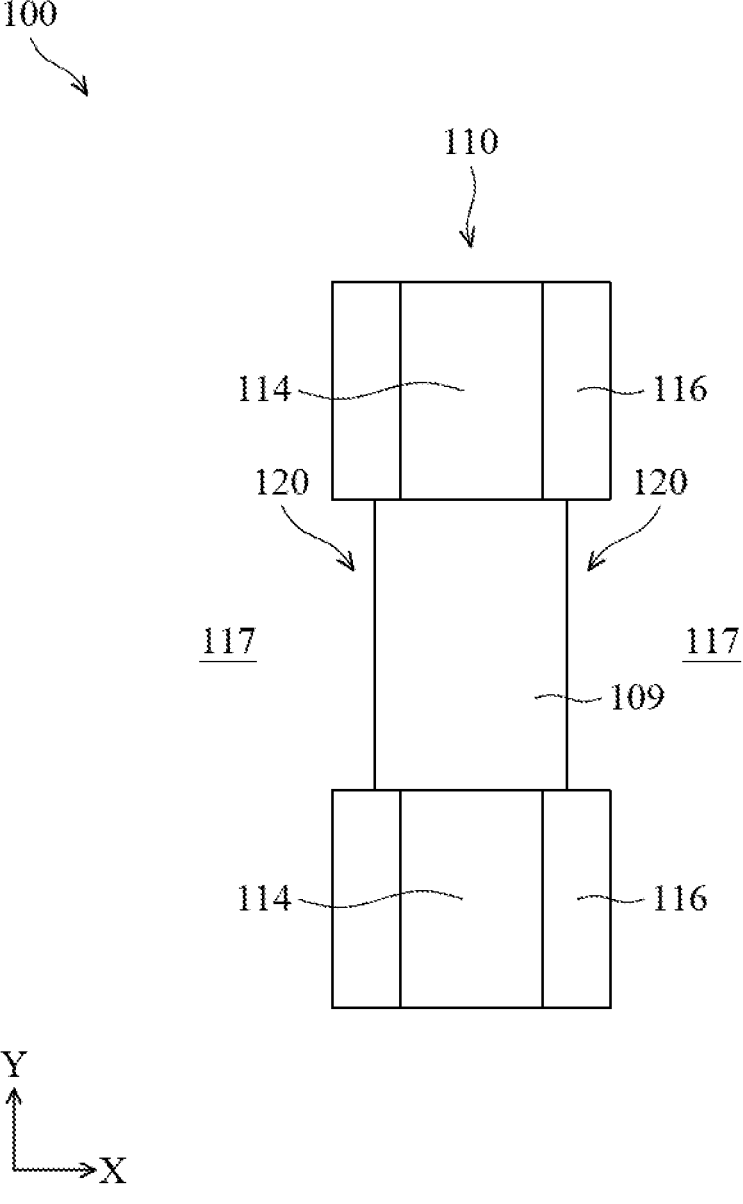

FIG. 1I is a plane view of the integrated circuit 100 taken through cut lines 1I of FIG. 1G, in accordance with some embodiments. FIG. 1I illustrates a sacrificial semiconductor nanostructure 109 with source/drain trenches 117 on either side in the X direction. FIG. 1I also illustrates the portions of the sacrificial gate layer 114 and gate spacer layer 116 on either side of the sacrificial semiconductor nanostructure 109 in the Y direction. FIG. 1I also illustrates the recesses 120 in the sacrificial semiconductor layer 109.

Figure 1J:
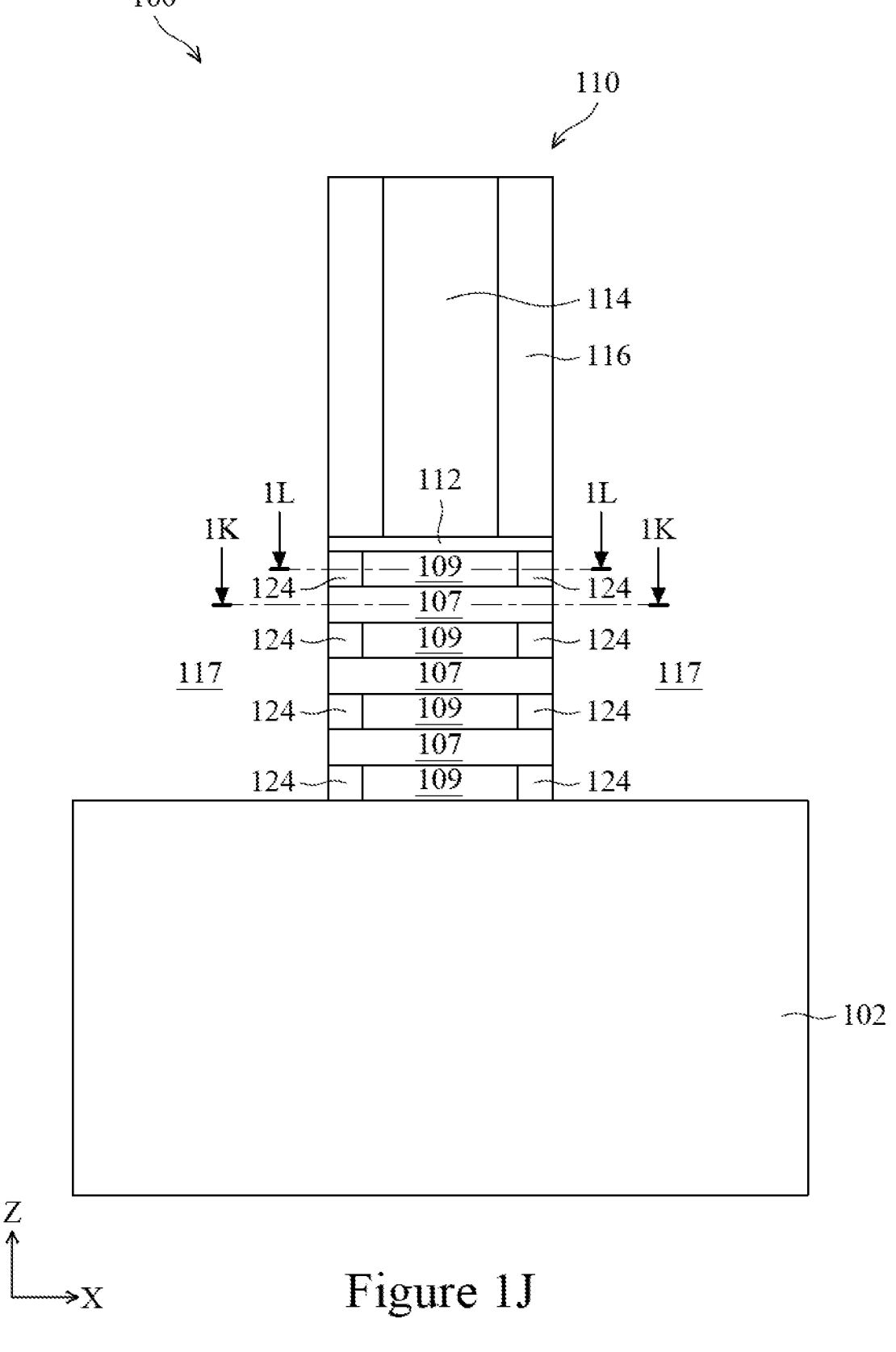

FIG. 1J is an X view of the integrated circuit 100, in accordance with some embodiments. In FIG. 1J, inner spacers 124 have been formed in the recesses 120. The inner spacers are formed by depositing a dielectric material to fill the recesses 120 between the semiconductor nanostructures 107 formed by the previous selective etching process. The inner spacer 124 may be a suitable dielectric material, such as silicon carbon nitride (SiCN), silicon oxycarbonitride (SiOCN), or the like, formed by a suitable deposition method such as physical vapor deposition (PVD), CVD, ALD, or the like. The inner spacers 124 may each have substantially a same width. Other materials and deposition processes can be utilized for the inner spacers 124 without departing from the scope of the present disclosure.

After deposition of the inner spacers 124, an etching process, such as an anisotropic etching process, is performed to remove portions of the inner spacers 124 disposed outside the recesses 120 in the sacrificial semiconductor nanostructures 109. In particular, the outer walls or surfaces of the gate spacer layers 116 are utilized as a mask or pattern for defining the outer edges or sidewalls of the inner spacers 124. Accordingly, the outer walls of the inner spacers 124 are substantially aligned with, or coplanar with, the outer walls of the gate spacer layers 116. The result is the inner spacers 124 are shown in FIG. 1J.

Figure 1K:
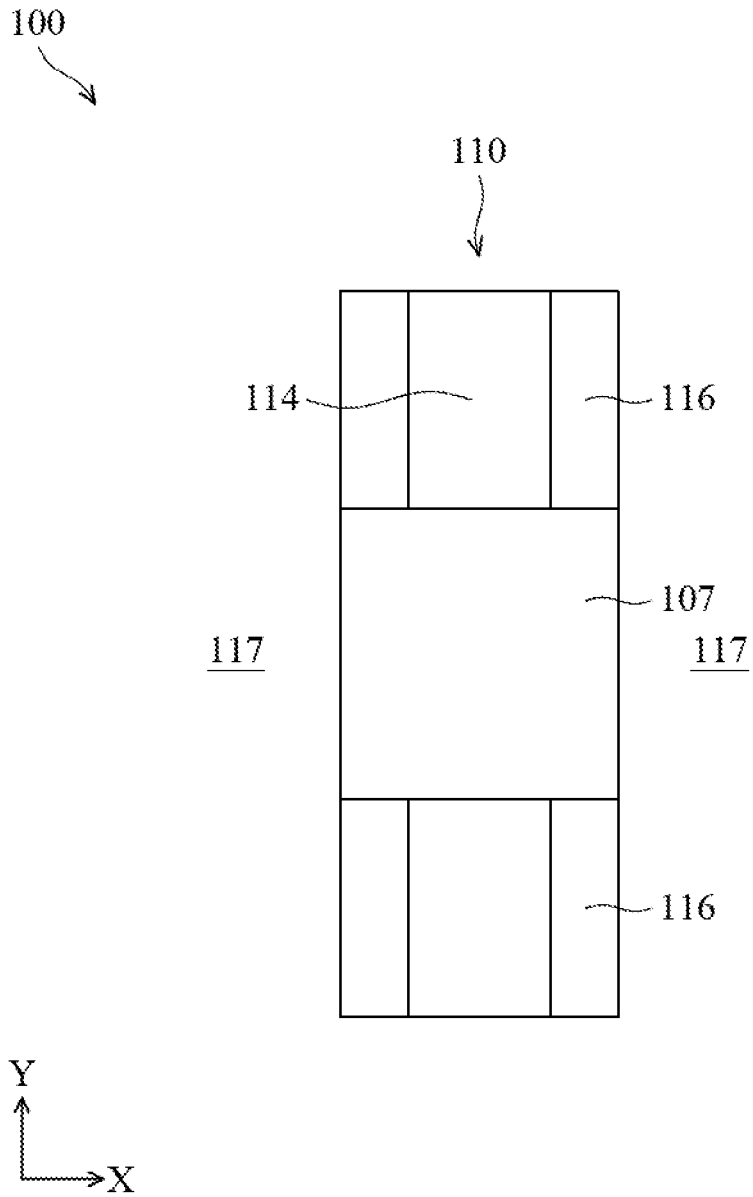

FIG. 1K is a plane view of the integrated circuit 100 taken through cut lines 1K of FIG. 1J, in accordance with some embodiments. FIG. 1K illustrates a semiconductor nanostructure 107 with source/drain trenches 117 on either side in the X direction. FIG. 1K also illustrates the portions of the sacrificial gate layer 114 and gate spacer layer 116 on either side of the semiconductor nanostructure 107 in the Y direction.

Figure 1L:
Figure 1L:
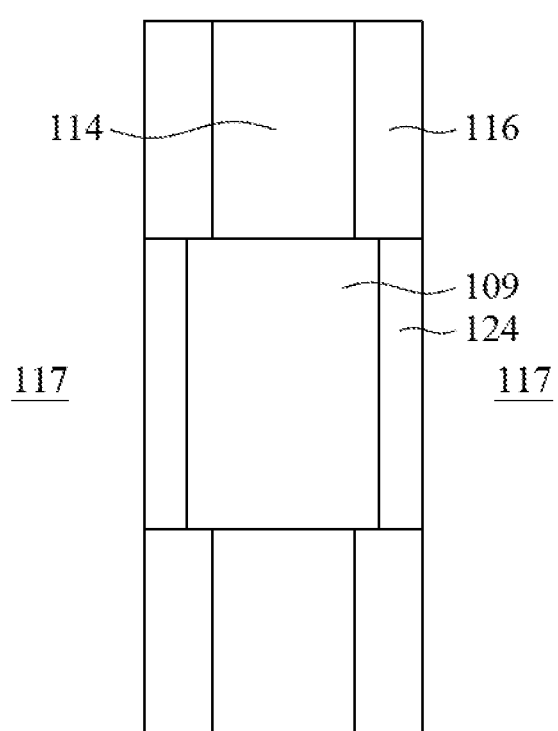
Figure 1L:
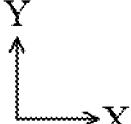

FIG. 1L is a plane view of the integrated circuit 100 taken through cut lines 1L of FIG. 1J, in accordance with some embodiments. FIG. 1L illustrates a sacrificial semiconductor nanostructure 109 with source/drain trenches 117 on either side in the X direction. FIG. 1L also illustrates the portions of the sacrificial gate layer 114 and gate spacer layer 116 on either side of the sacrificial semiconductor nanostructure 109 in the Y direction. FIG. 1L also illustrates the inner spacers 124 formed in the recesses 120 in the sacrificial semiconductor layer 109.

Figure 1M:
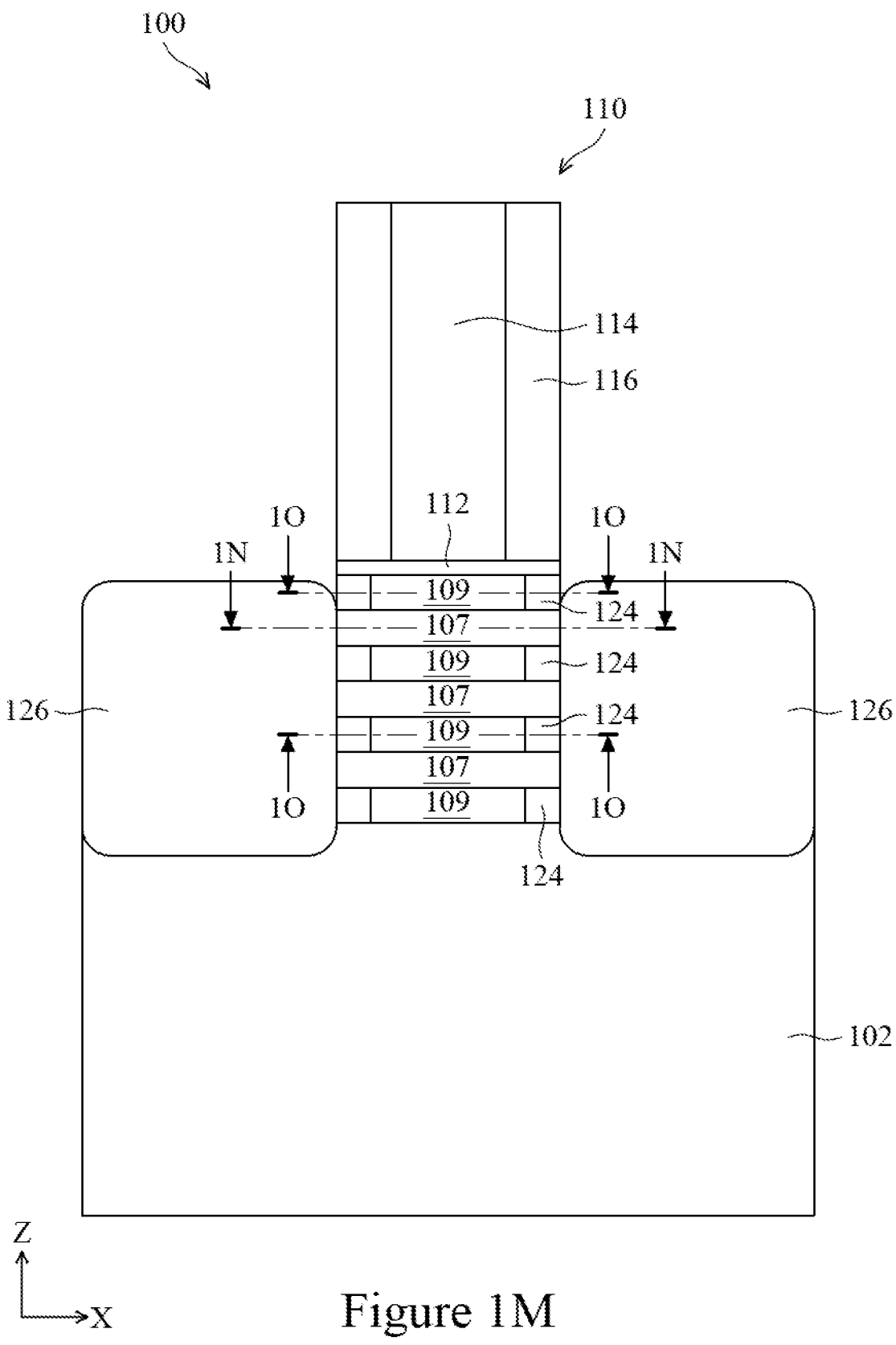

In FIG. 1M source/drain regions 126 have been formed. In the illustrated embodiment, the source/drain regions 126 are epitaxially grown from epitaxial material(s). The source/drain regions 126 are grown on exposed portions of the fins and contact the semiconductor nanostructures 107. Each semiconductor nanostructure 107 extends in the X direction between two source/drain regions 126. Each semiconductor nanostructure 107 may carry a current between source/drain regions 126 when processing the integrated circuit 100 is complete. In some embodiments, the upper portions of the source/drain regions 126 have rounded corner regions above the highest semiconductor nanostructure 107. In some embodiments, the source/drain regions 126 have a greater width in the X direction at a vertical level of the top semiconductor nanostructure 107 than at a vertical level higher than the top semiconductor nanostructure 107. This may be a result of the epitaxial growth of the source/drain regions 126 from the semiconductor nanostructures 107.

The source/drain regions 126 may include any acceptable material, such as appropriate for n-type or p-type devices. For n-type devices, the source/drain regions 126 include materials exerting a tensile strain in the channel regions, such as silicon, SiC, SiCP, SiP, or the like, in some embodiments. When p-type devices are formed, the source/drain regions 126 include materials exerting a compressive strain in the channel regions, such as SiGe, SiGeB, Ge, GeSn, or the like, in accordance with certain embodiments. The source/drain regions 126 may have surfaces raised from respective surfaces of the fins and may have facets. Neighboring source/drain regions 126 may merge in some embodiments to form a singular source/drain region 126 over two neighboring fins of the fins.

The source/drain regions 126 may be implanted with dopants followed by an annealing process. The source/drain regions 126 may have an impurity concentration of between about $10^{19}$ cm$^{-3}$ and about $10^{21}$ cm$^{-3}$. N-type and/or p-type impurities for source/drain regions 126 may be any of the impurities previously discussed. In some embodiments, the source/drain regions 126 are in situ doped during growth.

Figure 1N:
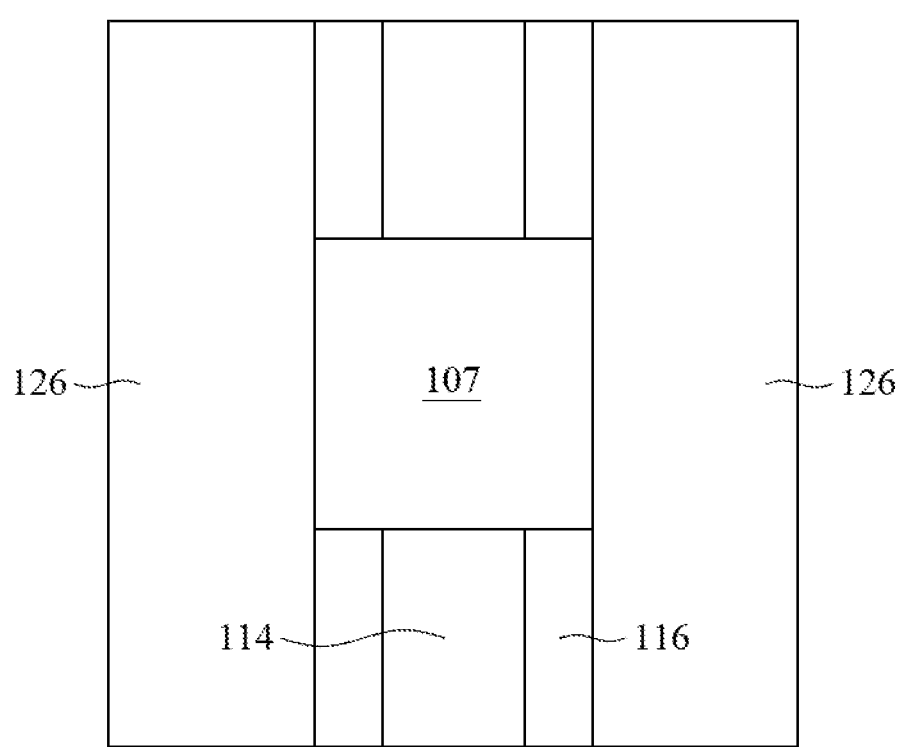

FIG. 1N is a plane view of the integrated circuit 100 taken through cut lines 1N of FIG. 1M, in accordance with some embodiments. FIG. 1N illustrates a semiconductor nanostructure 107 with source/drain regions 126 on either side in the X direction. FIG. 1N also illustrates the portions of the sacrificial gate layer 114 and gate spacer layer 116 on either side of the semiconductor nanostructure 107 in the Y direction.

Figure 1O:
Figure 1O:
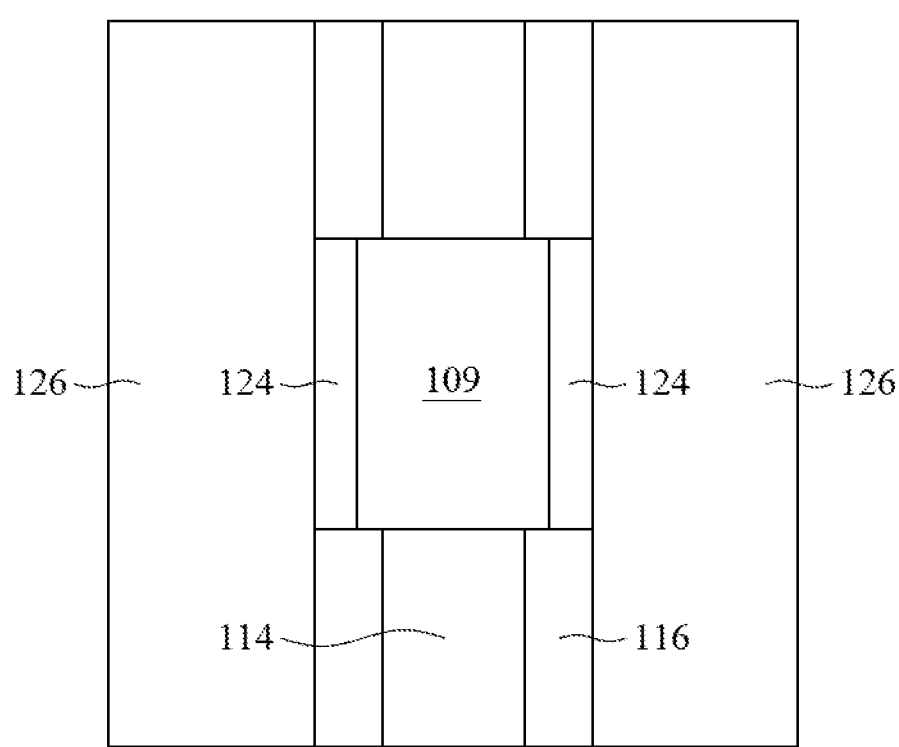
Figure 1O:
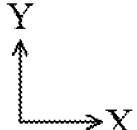

FIG. 1O is a plane view of the integrated circuit 100 taken through cut lines 1O of FIG. 1M, in accordance with some embodiments. FIG. 1O illustrates the portions of the sacrificial gate layer 114 and gate spacer layer 116 on either side of the sacrificial semiconductor nanostructure 109 in the Y direction. FIG. 1O also illustrates the inner spacers 124 formed in the recesses 120 in the sacrificial semiconductor layer 109. FIG. 1O illustrates the source/drain regions 126 in contact with the inner spacers 124. Accordingly, the inner spacers 124 effectively separate the sacrificial semiconductor layers 109 from the source/drain regions 126.

Figure 1P:

In FIG. 1P, an interlayer dielectric (ILD) 128 have been formed. The dielectric layer 128 covers the source/drain regions 126. The dielectric layer 128 can include SiO, SiON, SiN, SiC, SiOC, SiOCN, SiON, or other suitable dielectric materials. The dielectric layer 128 can be deposited by CVD, ALD, PVD, or other suitable deposition processes. The dielectric layer 128 is in contact with the gate spacer layers 116. In some embodiments, one or more dielectric liner layers or other types of spacer layers may be conformally deposited on the source/drain regions 126 and the sidewalls of the gate spacer layers 116 prior to deposition of the dielectric layer 128.

In FIG. 1P, the sacrificial gate structures 110 have been removed from between the gate spacer layers 116. Removal of the sacrificial gate structures 110 includes removal of the dielectric layer 112 and the sacrificial gate layer 113 via one or more etching processes. Removal of the sacrificial gate structure 110 can include first performing a planarization process, such as a CMP to level the top surfaces of the sacrificial gate layer 114 and gate spacer layer 116. The planarization process may also remove the first and second upper dielectric layers on the sacrificial gate layer 114, and portions of the gate spacer layer 116 along sidewalls of the first and second upper dielectric layers. Accordingly, the top surfaces of the sacrificial gate layer 114 are exposed.

Next, the sacrificial gate layer 114 can be removed by an etching process, so that voids 130a are formed between the gate spacer layers 116. In some embodiments, the sacrificial gate layer 114 is removed by an anisotropic dry etch process. For example, the etching process may include a dry etch process using reaction gases that selectively etch the sacrificial gate layer 114 without etching the spacer layer 116. The dielectric layer 112, when present, may be used as an etch stop layer when the sacrificial gate layer 114 is etched. The dielectric layer 112 may then be removed after the removal of the sacrificial gate layer 114.

In FIG. 1P, semiconductor nanostructures 107 are released by removal of the sacrificial semiconductor nanostructures 109. The sacrificial semiconductor nanostructures 109 are removed to release the semiconductor nanostructures 107. The sacrificial semiconductor nanostructures 109 can be removed by a selective etching process using an etchant that is selective to the material of the sacrificial semiconductor nanostructures 109, such that the sacrificial semiconductor nanostructures 109 are removed without substantially etching the semiconductor nanostructures 107. In some embodiments, the etching process is an isotropic etching process using an etching gas, and optionally, a carrier gas, where the etching gas comprises F2 and HF, and the carrier gas may be an inert gas such as Ar, He, N2, combinations thereof, or the like. In some embodiments, the sacrificial semiconductor nanostructures 109 are removed and the semiconductor nanostructures 107 are patterned to form channel regions of both PFETs and NFETs.

In some embodiments, the semiconductor nanostructures 107 are reshaped (e.g., thinned) by a further etching process to improve gate fill window. The reshaping may be performed by an isotropic etching process selective to the semiconductor nanostructures 107. After reshaping, the semiconductor nanostructures 107 may exhibit the dog bone shape in which middle portions of the semiconductor nanostructures 107 are thinner than peripheral portions of the semiconductor nanostructures 107 along the X-axis direction. Removal of the sacrificial semiconductor nanostructures results in the voids 130b adjacent to the semiconductor nanostructures 107.

The void 130a has a dimension D1 in the X direction. The void 130b has a dimension D2 in the X direction. The dimension D1 is smaller than the dimension D2. More particularly, the difference between the dimension D1 and D2 corresponds to the difference in width between the gate spacer layers 116 and the inner spacers 124. In some embodiments, the dimension D2 has a value between 10 nm and 15 nm. In some embodiments, the dimension D1 has a value between 7 nm and 14 nm. Other values can be utilized for D1 and D2 without departing from the scope of the present disclosure. As will be set forth in more detail below, the difference in the dimensions D1 and D2 can result in improved electrical performance of the transistor 135 that will result in the processing of the integrated circuit 100.

Figure 1Q:
Figure 1Q:
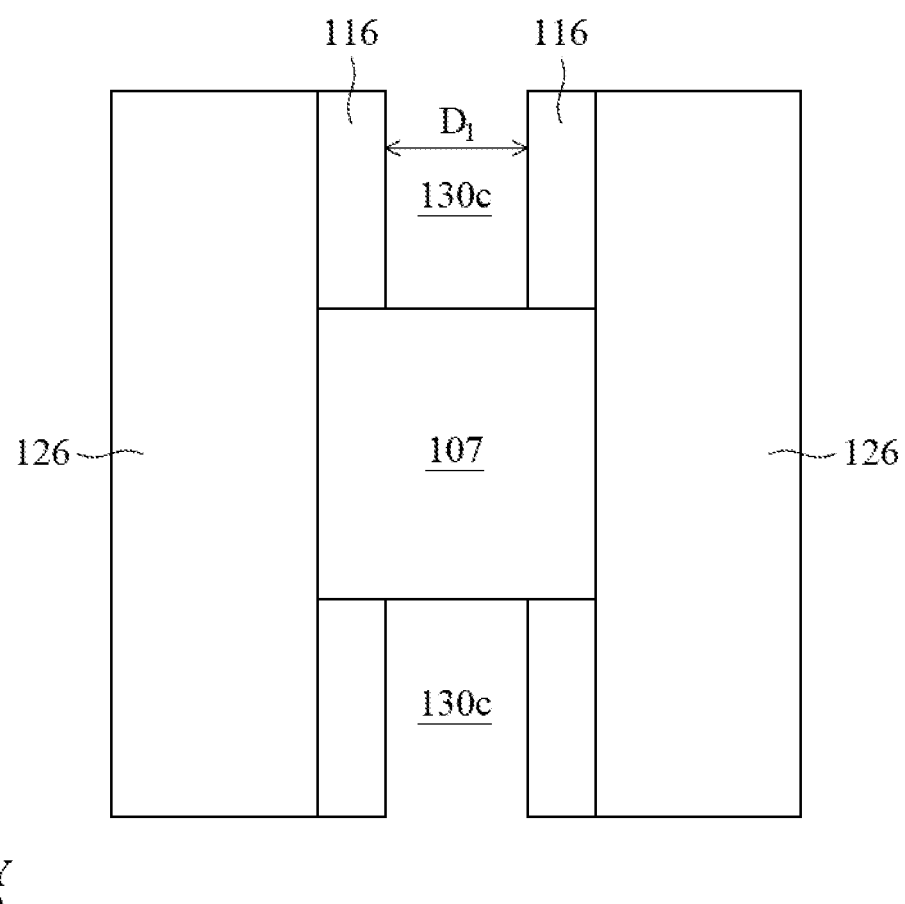

FIG. 1Q is a plane view of the integrated circuit 100 taken through cut lines 1Q of FIG. 1P, in accordance with some embodiments. FIG. 1Q illustrates a semiconductor nanostructure 107 with source/drain regions 126 on either side in the X direction. FIG. 1Q illustrates voids 130c on either side of the semiconductor nanostructure 107 in the Y direction. The void 130c is contiguous with the voids 130a and 130b. The void 130c is separately numbered only to illustrate that the void narrows to the dimension D1 laterally from the semiconductor nanostructures 107 in the Y direction, not only above the semiconductor nanostructures 107.

Figure 1R:
Figure 1R:
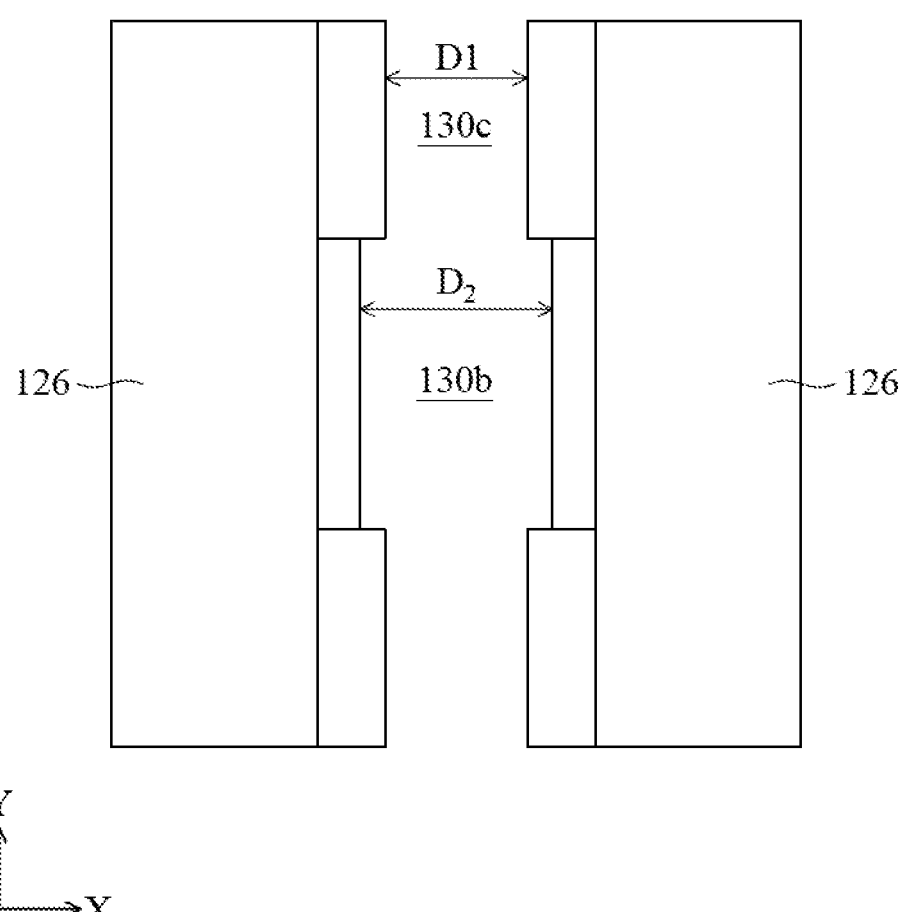

FIG. 1R is a plane view of the integrated circuit 100 taken through cut lines 1R of FIG. 1P, in accordance with some embodiments. FIG. 1R illustrates a void 130b left in place of the semiconductor nanostructure 109 that was previously removed. FIG. 1R illustrates that the void 130b has a dimension D2 in the X direction.

Figure 1S:
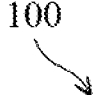
Figure 1S:

FIG. 1S is an X view of the integrated circuit 100, in accordance with some embodiments. In FIG. 1S, a gate metal 134 has been deposited in the void. In particular, the gate metal 134 is deposited in the void 130a above the semiconductor nanostructures 107 between the gate spacer layers 136 and in the void 130b around the semiconductor nanostructures 107. Though not apparent in FIG. 1S, the gate metal 134 is also deposited in the voids 130c lateral to the semiconductor nanostructures 107 and the Y direction. The portion of the gate metal 134 in the void 130a may be termed an upper portion 134a of the gate metal. The portion of the gate metal 134 in the voids 130b around the semiconductor nanostructures 107 may be termed an interior or lower portion 134b of the gate metal 134. The portion of the gate metal 134 lateral from the semiconductor nanostructures 107 in the Y direction in the voids 130c may be termed an outer portion 134c of the gate metal 134.

Although the gate metal 134 is shown as a single layer in FIG. 1S, in practice, the gate metal 134 can include one or more conductive liner layers, work function layers, and gate fill layers that collectively make up the gate metal. The gate metal can include one or more of Ti, TiN, Ta, TaN, Al, Cu, Co, Ru, W, Au, or other suitable conductive materials. The gate metal 134 can be deposited by PVD, ALD, or CVD. Other configurations, materials, and deposition processes can be utilized for the gate metal 134 without departing from the scope of the present disclosure.

Figure 1T:
Figure 1T:
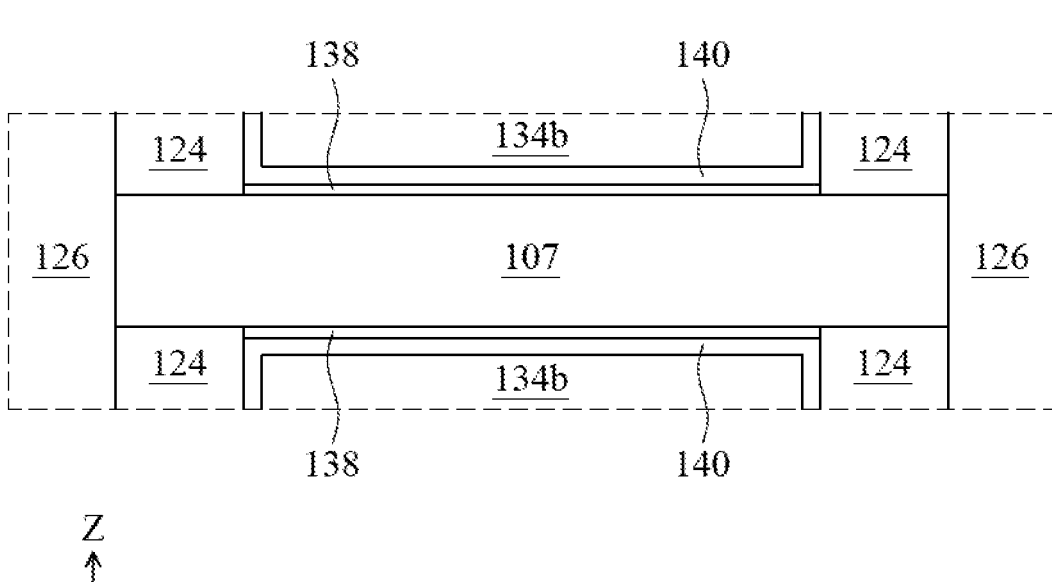

Though not shown in FIG. 1S, one or more gate dielectric layers are present between the semiconductor nanostructures 107 and the gate metal 134. The gate dielectric layers are shown in relation to FIG. 1T. FIG. 1T is an enlarged view of a portion of the integrated circuit 1S denoted by the box 1T in FIG. 1S.

With reference to FIG. 1T, prior to deposition of the gate metal 134, an interfacial dielectric layer 138 and a high K gate dielectric layer 140 have been deposited. The interfacial gate dielectric layer 138 is deposited on all exposed surfaces of the semiconductor nanostructures 107. The interfacial gate dielectric layer 138 surrounds the semiconductor nanostructures 107. The interfacial gate dielectric layer 138 can include a dielectric material such as silicon oxide, silicon nitride, or other suitable dielectric materials. The interfacial gate dielectric layer 138 can include a comparatively low-K dielectric with respect to high-K dielectric such as hafnium oxide or other high-K dielectric materials that may be used in gate dielectrics of transistors. High-K dielectrics can include dielectric materials with a dielectric constant higher than the dielectric constant of silicon oxide. The interfacial gate dielectric layer 138 can be formed by a thermal oxidation process, a chemical vapor deposition (CVD) process, or an atomic layer deposition (ALD) process. The interfacial gate dielectric layer 138 can have a thickness between 0.5 nm and 2 nm. Other materials, deposition processes, and thicknesses can be utilized for the interfacial gate dielectric layer 138 without departing from the scope of the present disclosure.

The high-K dielectric layer 140 is deposited in a conformal deposition process. The conformal deposition process deposits the high-K dielectric layer 140 on the interfacial gate dielectric layer 138. The high-K dielectric layer 140 may also deposited on sidewalls of the gate spacer layers 116 and the inner spacers 124. The high-K gate dielectric layer 140 surrounds the semiconductor nanostructures 107. The high-K gate dielectric layer 140 has a thickness between 1 nm and 3 nm. The high-K dielectric layer includes one or more layers of a dielectric material, such as $HfO_2$, HfSiO, HfSION, HfTaO, HfTIO, HfZrO, zirconium oxide, aluminum oxide, titanium oxide, hafnium dioxide-alumina ($HfO_2$—$Al_2O_3$) alloy, other suitable high-K dielectric materials, and/or combinations thereof. The high-K dielectric layer 140 may be formed by CVD. ALD, or any suitable method. Other thicknesses, deposition processes, and materials can be utilized for the high-K dielectric layer 140 without departing from the scope of the present disclosure.

Returning to FIG. 1S, The gate metal 134 is deposited in contact with the high-K dielectric layer 140. The gate metal 134 substantially surrounds semiconductor nanostructures 107. At the stage of processing shown in FIG. 1O, the transistor 135 is substantially complete. The transistor 135 includes semiconductor nanostructures 107 extending between the source/drain regions 126 and acting as stacked channels of the transistor 135. The gate metal 134 acts as a gate electrode surrounding the semiconductor nanostructures 107.

Figure 1U:
Figure 1U:
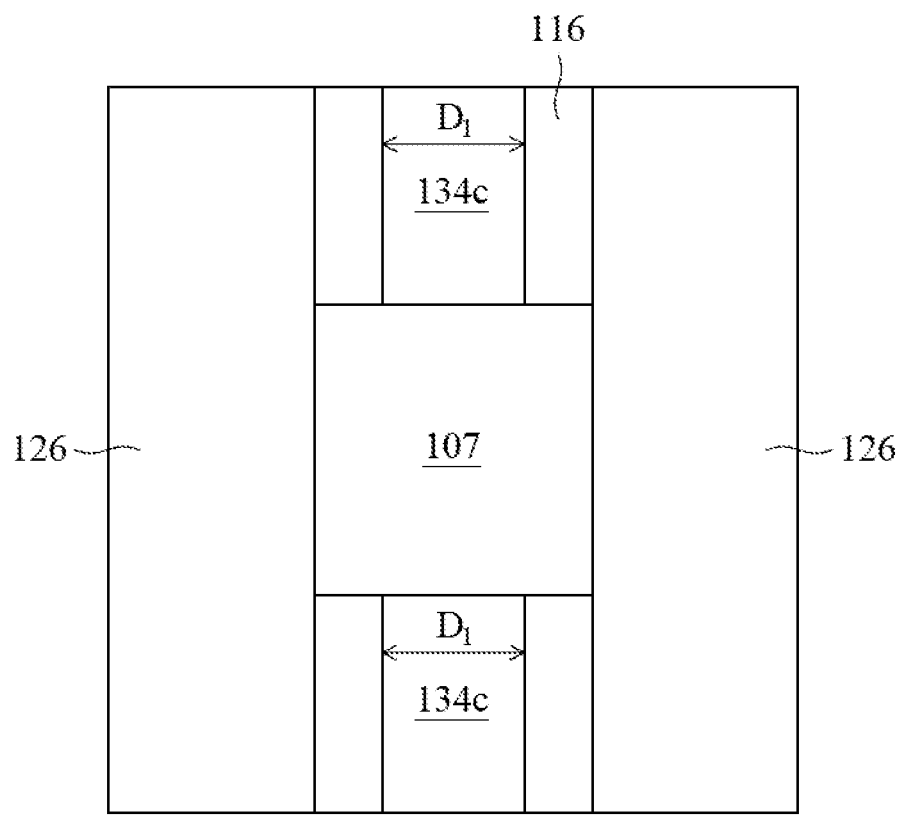

FIG. 1U is a plane view of the integrated circuit 100 taken through cut lines 1U of FIG. 1S, in accordance with some embodiments. FIG. 1U illustrates a semiconductor nanostructure 107 with source/drain regions 126 on either side in the X direction. FIG. 1U illustrates voids the gate metal 134c on either side of the semiconductor nanostructure 107 in the Y direction. The gate metal 134c has a gate length in the X direction of dimension D1.

Figure 1V:
Figure 1V:
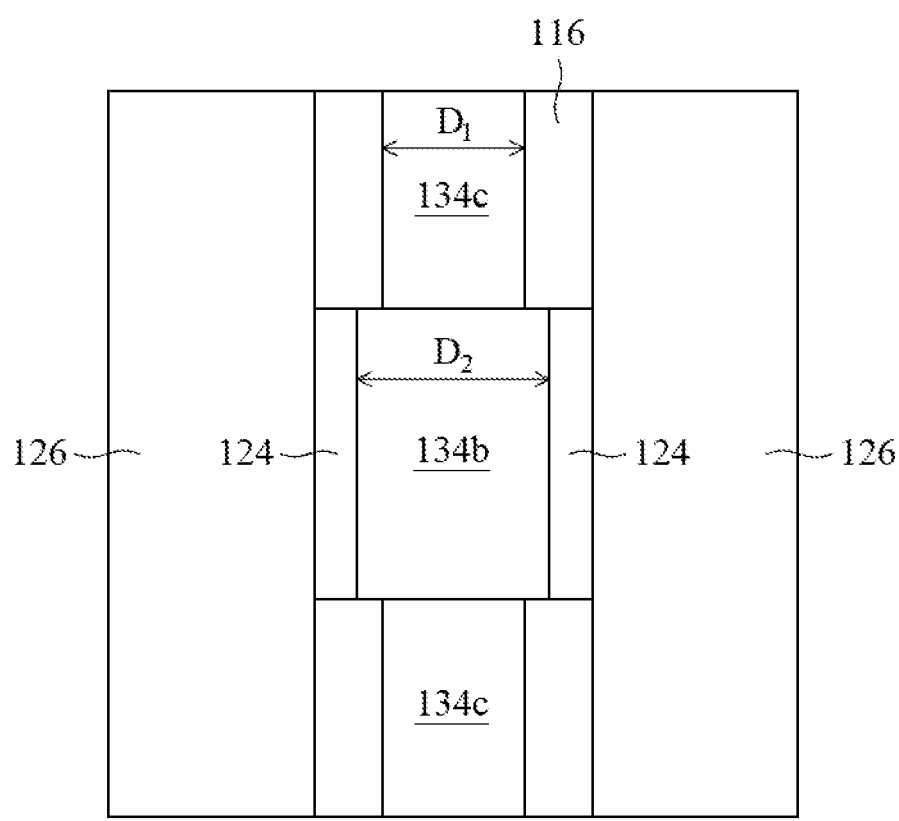

FIG. 1V is a plane view of the integrated circuit 100 taken through cut lines 1S of FIG. 1S, in accordance with some embodiments. FIG. 1V illustrates the gate metal 134b in place of the semiconductor nanostructure 109 that was previously removed. FIG. 1V illustrates that the gate metal 134b has a gate length in the X direction of the dimension D2.

Figure 1W:
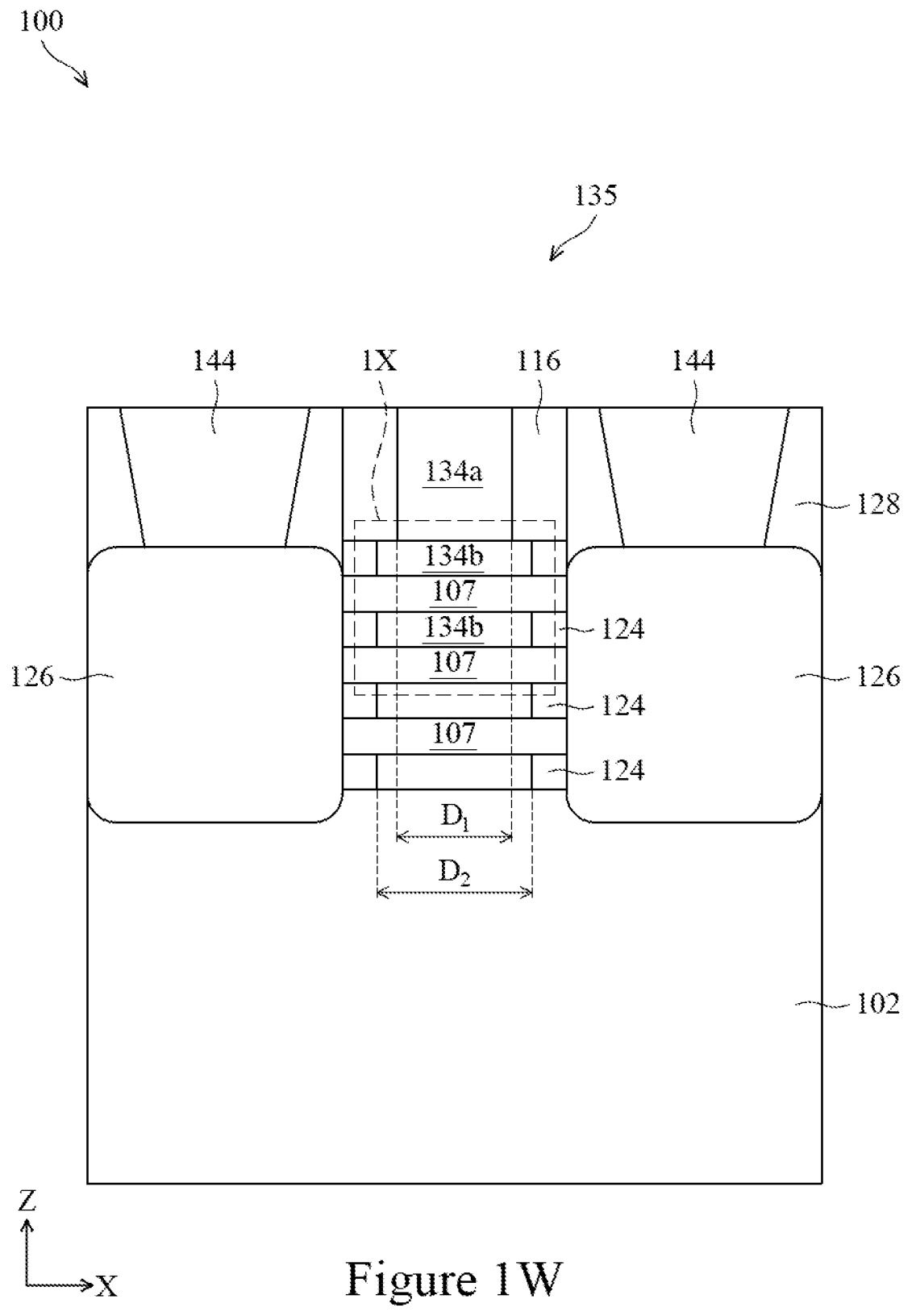

FIG. 1W is an X view of the integrated circuit 100, in accordance with some embodiments. In FIG. 1W, source/drain contacts 144 have been formed in the dielectric layer 128. The source/drain contacts 144 contact the source/drain regions 126. The source/drain contacts 144 can include a conductive material such as aluminum, cobalt, ruthenium, copper, tungsten, titanium, titanium nitride, tantalum, tantalum nitride, or other conductive materials. The source/drain contacts 144 may include a silicide layer in contact with the source/drain regions 126. The source/drain contacts 144 may include one or more liner layers directly in contact with the dielectric layer 128.

The source/drain contacts 144 are separated from the gate metal 134a by the gate spacer layers 116 and portions of the dielectric layer 128. Because the gate metal 134a has a relatively narrow dimension D1, and because the gate spacer layers 116 are relatively wide, the gate to drain capacitance between the gate metal 134a and the source/drain contacts 144 is relatively low. Because the gate metal 134b has a longer gate length dimension D2 around the semiconductor nanostructures 107, resistances low and electrical control of the channel regions 107 is high.

Figure 1X:
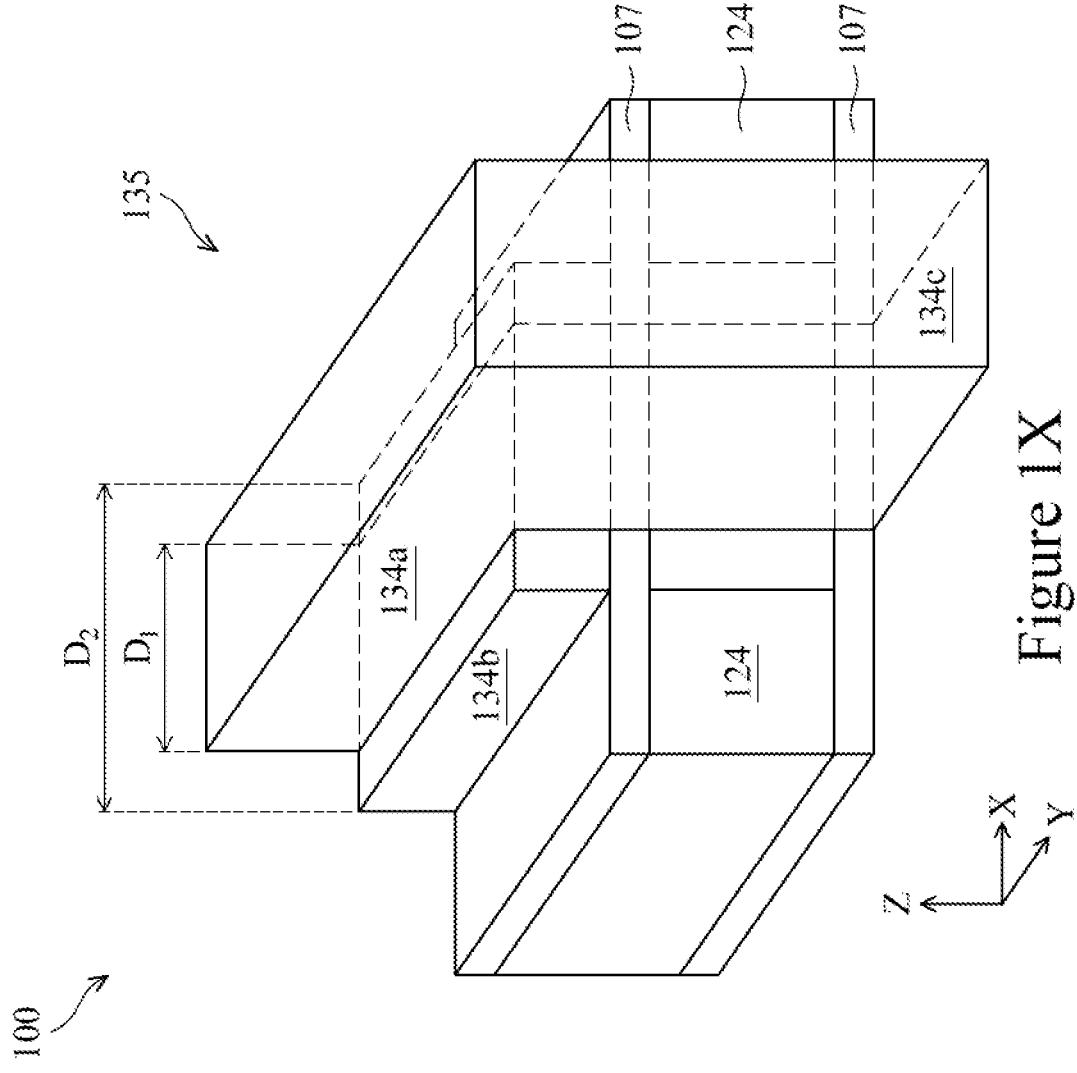

FIG. 1X is an enlarged perspective view of a portion of the integrated circuit 100, in accordance with some embodiments. The view of FIG. 1F corresponds to the box 1X of FIG. 1W. FIG. 1X does not illustrate the interlevel dielectric layer 128 the gate spacer layer 116, for the uppermost inner spacers 124 in order to more clearly illustrates the relative dimensions of the three portions of the gate metal 134. The upper portion 134a is positioned above the top semiconductor nanostructure 107 and has a gate length dimension D1 in the X direction. The lower or interior portion 134b of the gate metal 134 has a gate length dimension D2 in the X direction limited by the distance between the inner spacers 124 for the X direction. The outer portion 134c of the gate metal 134 has the gate length dimension D1. Because the upper portion 134a and the outer portion 134c have the smaller gate length dimension D1, gate to drain capacitance is relatively low. Because the interior portion 134b has the larger gate length dimension D2, the gate metal 134 provides good electrical control in enabling and preventing current flow through the semiconductor nanostructures 107. Various other configurations of an integrated circuit 100 can be utilized without departing from the scope of the present disclosure.

FIG. 2 is a flow diagram of a method 200 for forming an integrated circuit, in accordance with some embodiments. The method 200 can utilize the structures, processes, and systems described in relation to FIGS. 1A-1X. At 202, the method 200 includes forming a plurality of stacked semiconductor nanostructures each extending in a first direction from a first source/drain region to a second source/drain region. One example of stacked semiconductor nanostructures are the semiconductor nanostructures 107 of FIG. 1W. One example of first and second source/drain regions are the first and second source/drain regions 126 of FIG. 1W. At 204, the method 200 includes forming a gate spacer structure above the semiconductor nanostructures. One example of a gate spacer structure is the gate spacer layers 116 of FIG. 1W. At 206, the method 200 includes forming a plurality of inner spacers between the semiconductor nanostructures. One example of inner spacers are inner spacers 124 of FIG. 1W. At 208, the method 200 includes forming a gate metal having an upper portion bounded in the first direction by the gate spacer structure and having a first width in the first direction, the gate metal having an interior portion between the semiconductor nanostructures bounded in the first direction by the inner spacers and having a second width in the first direction less than the first width. One example of a gate metal is the gate metal 134 of FIG. 1W. One example of an upper portion is the upper portion 134a of FIG. 1W. One example of interior portion is the interior portion 134b of FIG. 1W.

FIG. 3 is a flow diagram of a method 300 for forming an integrated circuit, in accordance with some embodiments. The method 300 can utilize the structures, processes, and systems described in relation to FIGS. 1A-1X. At 302, the method 300 includes forming a plurality of stacked semiconductor nanostructures. One example of semiconductor nanostructures are the semiconductor nanostructures 107 of FIG. 1J. At 304, the method 300 includes forming a plurality of stacked sacrificial semiconductor nanostructures vertically interleaved with the semiconductor nanostructures. At 306, the method 300 forming a sacrificial gate layer above the semiconductor nanostructures and having a first width in a first lateral direction. One example of a sacrificial gate layer is the sacrificial gate layer 114 of FIG. 1J. At 308, the method 300 includes forming first and second gate spacer layers on sidewalls of the sacrificial gate layer each having a second width in the first lateral direction. One example of gate spacer layers are the gate spacer layers 116 of FIG. 1J. At 310, the method 300 includes forming recesses in the sacrificial semiconductor nanostructures in the first lateral direction with a third width in the first lateral direction less than the second width. One example of recesses are the recesses 120 of FIG. 1G. At 312, the method 300 includes forming inner spacers in the recesses having the third width and each having an outer sidewall aligned with an outer sidewall of either the first gate spacer layer or the second gate spacer layer. One example of inner spacers are the inner spacers 124 of FIG. 1J.

Embodiments of the disclosure reduce a gate to drain capacitance by providing a semiconductor nanostructure transistor having a plurality of semiconductor nanostructures and a gate electrode having differing widths at different areas of the transistor. The gate electrode includes one or more gate metals. A lower portion of the gate metal surrounds the semiconductor nanostructures. An upper portion of the gate metal is positioned above the semiconductor nanostructures. The lower portion of the gate metal has a gate length that is larger than the gate length of the upper portion of the gate metal. The reduced length of the second portion of the gate metal results in a reduced gate to drain capacitance. The reduction in gate to drain capacitance is based, in part, on an increased separation distance between the upper portion of the gate electrode and the adjacent source/drain contacts. The result is a transistor having improved electrical characteristics including switching speed, channel control, and overall reliability. This leads to better functioning integrated circuits and higher wafer yields.

In one embodiment, a device includes a semiconductor substrate, a first source/drain region of a transistor, and a second source/drain region of the transistor. The device includes a plurality of stacked semiconductor nanostructures over the substrate and corresponding to channel regions of the transistor and each extending in a first direction between the first and second source/drain regions. The device includes a gate metal including an upper portion above the semiconductor nanostructures and having a first width in the first direction and an interior portion between the semiconductor nanostructures and having a second width in the first direction larger than the first width.

In one embodiment, a method includes forming a plurality of stacked semiconductor nanostructures each extending in a first direction from a first source/drain region to a second source/drain region and forming a gate spacer structure above the semiconductor nanostructures. The method includes forming a plurality of inner spacers between the semiconductor nanostructures and forming a gate metal having an upper portion bounded in the first direction by the gate spacer structure and having a first width in the first direction, the gate metal having an interior portion between the semiconductor nanostructures bounded in the first direction by the inner spacers and having a second width in the first direction less than the first width.

In one embodiment, a method includes forming a plurality of stacked semiconductor nanostructures, forming a plurality of stacked sacrificial semiconductor nanostructures vertically interleaved with the semiconductor nanostructures, and forming a sacrificial gate layer above the semiconductor nanostructures and having a first width in a first lateral direction. The method includes forming first and second gate spacer layers on sidewalls of the sacrificial gate layer each having a second width in the first lateral direction, forming recesses in the sacrificial semiconductor nanostructures in the first lateral direction with a third width in the first lateral direction less than the second width, and forming inner spacers in the recesses having the third width and each having an outer sidewall aligned with an outer sidewall of either the first gate spacer layer or the second gate spacer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a semiconductor substrate;
   a first source/drain region of a transistor;
   a second source/drain region of the transistor;
   a plurality of stacked semiconductor nanostructures over the substrate and corresponding to channel regions of the transistor and each extending in a first direction between the first and second source/drain regions;

a plurality of first inner spacers each in contact with at least one of the semiconductor nanostructures and the first source/drain region, wherein a highest first inner spacer of the plurality of first inner spacers is on top of a highest semiconductor nanostructure of the plurality of semiconductor nanostructures and has a top surface that is higher than a top surface of the first source/drain region;

a plurality of second inner spacers each in contact with at least one of the semiconductor nanostructures and the second source/drain region, wherein a highest second inner spacer of the plurality of second inner spacers is on top of the highest semiconductor nanostructure;

a first gate spacer layer on a top surface of the highest first inner spacer;

a second gate spacer layer on a top surface of the highest second inner spacer;

a dielectric layer on the first source/drain region;

a source/drain contact extending through the dielectric layer to electrically couple to the first source/drain region, wherein the dielectric layer includes a first portion in contact with a sidewall of the first gate spacer layer between the first gate spacer layer and the source/drain contact, wherein the dielectric layer includes a second portion in contact with a sidewall of the highest first inner spacer between the highest first inner spacer and the first source/drain region; and a gate metal including:

an upper portion above the semiconductor nanostructures and having a first width in the first direction; and an interior portion between the semiconductor nanostructures and having a second width in the first direction larger than the first width, wherein the upper portion of the gate metal is positioned between the first and second gate spacer layers.

2. The device of claim 1, wherein a width of the first inner spacers in the first direction is less than a width of the first gate spacer layer in the first direction.

3. The device of claim 2, wherein the first inner spacers each have an outer sidewall in contact with the first source/drain region and substantially coplanar with an outer sidewall of the first gate spacer layer.

4. The device of claim 3, wherein each first inner spacer includes an interior sidewall laterally offset with respect to an interior sidewall of the first gate spacer layer.

5. The device of claim 4, wherein a width of the second inner spacers in the first direction is less than a width of the second gate spacer layer in the first direction.

6. The device of claim 5, wherein the second inner spacers each have an outer sidewall in contact with the second source/drain region and substantially coplanar with an outer sidewall of the second gate spacer layer.

7. The device of claim 6, wherein each second inner spacer includes an interior sidewall laterally offset with respect to an interior sidewall of the second gate spacer layer.

8. The device of claim 5, wherein the first and second inner spacers collectively bound the interior portion of the gate metal in the first direction.

9. The device of claim 2, wherein the first inner spacers each have a substantially same width.

10. The device of claim 1, wherein the gate metal includes an outer portion spaced apart from the semiconductor nanostructures in a second horizontal direction substantially perpendicular to the first horizontal direction and having a third width in the first direction less than the second width.

11. The device of claim 10, wherein the third width is equal to the first width.

12. A method, comprising:

forming a plurality of stacked semiconductor nanostructures each extending in a first direction from a first source/drain region to a second source/drain region;

forming a gate spacer structure above the semiconductor nanostructures;

forming a plurality of inner spacers between the semiconductor nanostructures; and forming a gate metal having an upper portion bounded in the first direction by the gate spacer structure and having a first width in the first direction, the gate metal having an interior portion between the semiconductor nanostructures bounded in the first direction by the inner spacers and having a second width in the first direction less than the first width;

forming a dielectric layer over the first source/drain region;

forming a source/drain contact extending through the dielectric layer to electrically couple to the first source/drain region, wherein a highest inner spacer of the plurality of inner spacers is in contact with the source/drain region and the dielectric layer and has a top surface that is higher than a top surface of the first source/drain region, wherein the dielectric layer includes a first portion in contact with a sidewall of the gate spacer structure between the gate spacer structure and the source/drain contact, wherein the dielectric layer includes a second portion in contact with a sidewall of the highest inner spacer between the highest inner spacer and the first source/drain region.

13. The method of claim 12, comprising:

forming, prior to forming the gate metal, a plurality of stacked sacrificial semiconductor nanostructures vertically interleaved with the stacked semiconductor nanostructures;

forming, prior to forming the gate metal, a sacrificial gate layer above the semiconductor nanostructures;

forming the gate spacer structure on sidewalls of the sacrificial gate layer; and forming lateral recesses in the sacrificial semiconductor nanostructures with a third width in the first direction less than a width of the gate spacer structure.

14. The method of claim 13, comprising:

forming the inner spacers by depositing a dielectric material in the lateral recesses; and aligning outer sidewalls of the semiconductor nanostructures and the inner spacers with outer sidewalls of the gate spacer structure.

15. The method of claim 14, comprising:

removing the sacrificial gate layer;

removing the sacrificial semiconductor nanostructures;

depositing the interior portion of the gate metal in place of the sacrificial semiconductor nanostructures; and depositing the upper portion of the gate metal in place of the sacrificial gate layer.

16. The method of claim 12, wherein forming the gate metal includes forming an outer portion of the gate metal laterally adjacent to each of the semiconductor nanostructures in a second direction perpendicular to the first direction and having a third width less than the first width.

17. The method of claim 16, wherein the third width is equal to the second width.

18. A method, comprising:

forming a plurality of stacked semiconductor nanostructures;

forming a plurality of stacked sacrificial semiconductor nanostructures vertically interleaved with the semiconductor nanostructures;

forming a sacrificial gate layer above the semiconductor nanostructures and having a first width in a first lateral direction;

forming first and second gate spacer layers on sidewalls of the sacrificial gate layer each having a second width in the first lateral direction;

forming recesses in the sacrificial semiconductor nanostructures in the first lateral direction with a third width in the first lateral direction less than the second width; and forming a plurality of inner spacers in the recesses having the third width and each having an outer sidewall aligned with an outer sidewall of either the first gate spacer layer or the second gate spacer layer, wherein a highest inner spacer of the plurality of inner spacers is on top of a highest semiconductor nanostructure of the plurality of semiconductor nanostructures, wherein the first gate spacer layer is on a top surface of the highest inner spacer;

forming first and second source/drain regions, each of the semiconductor nanostructures extending in the first direction from the first source/drain region to the second source/drain region;

forming a dielectric layer over the first source/drain region; and forming a source/drain contact extending through the dielectric layer to electrically couple to the first source/drain region, wherein the highest inner spacer is in contact with the first source/drain region and the dielectric layer and has a top surface that is higher than a top surface of the first source/drain region, wherein the dielectric layer includes a first portion in contact with a sidewall of the first gate spacer layer between the first gate spacer layer and the source/drain contact, wherein the dielectric layer includes a second portion in contact with a sidewall of the highest inner spacer between the highest inner spacer and the first source/drain region.

19. The method of claim 18, comprising:

removing the sacrificial gate layer;

removing the sacrificial semiconductor layers;

forming an interior portion of a gate electrode between the semiconductor nanostructures in place of the sacrificial semiconductor nanostructures and bounded in the first direction by the inner spacers; and forming an upper portion of the gate electrode in place of the sacrificial gate layer.

20. The method of claim 19, comprising forming an outer portion of the gate electrode laterally adjacent to each of the semiconductor nanostructures in a second direction perpendicular to the first direction and being bounded in the first direction between the first and second gate spacer layers.

*     *     *     *     *